US009602943B2

(12) United States Patent
Deng et al.

(10) Patent No.: US 9,602,943 B2
(45) Date of Patent: Mar. 21, 2017

(54) AUDIO PROCESSING METHOD AND AUDIO PROCESSING APPARATUS

(71) Applicant: Dolby Laboratories Licensing Corporation, San Francisco, CA (US)

(72) Inventors: Huiqun Deng, Beijing (CN); Xuejing Sun, Beijing (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 200 days.

(21) Appl. No.: 14/384,439

(22) PCT Filed: Mar. 21, 2013

(86) PCT No.: PCT/US2013/033359
§ 371 (c)(1),
(2) Date: Sep. 11, 2014

(87) PCT Pub. No.: WO2013/142724
PCT Pub. Date: Sep. 26, 2013

(65) Prior Publication Data

US 2015/0104022 A1 Apr. 16, 2015

Related U.S. Application Data

(60) Provisional application No. 61/619,214, filed on Apr. 2, 2012.

(30) Foreign Application Priority Data

Mar. 23, 2012 (CN) .......................... 2012 1 0080868

(51) Int. Cl.
*H04R 5/00* (2006.01)
*H04S 1/00* (2006.01)
(Continued)

(52) U.S. Cl.
CPC .......... *H04S 1/007* (2013.01); *G10L 21/0364* (2013.01); *G10L 25/87* (2013.01); *H04S 2400/01* (2013.01); *H04S 2400/05* (2013.01)

(58) Field of Classification Search
CPC .. H04S 1/007; H04S 2400/01; H04S 2400/05; G10L 21/0364; G10L 25/87
(Continued)

(56) References Cited

U.S. PATENT DOCUMENTS 5,991,385 A * 11/1999 Dunn .................... H04M 3/568 379/202.01
7,315,816 B2 1/2008 Gotanda
(Continued)

FOREIGN PATENT DOCUMENTS

WO 2009/035614 1/2009
WO WO 2009035614 A1 * 3/2009 ............. H03G 9/005
WO 2011/026247 3/2011

OTHER PUBLICATIONS

W. Verhelst and M. Roelands, "An Overlap-Add Technique Based on Waveform Similarity (WSOLA) for High-Quality Time-Scale Modification of Speech," International Conference on Acoustics, Speech, and Signal Processing 1993 (vol. 2), IEEE, pp. 554-557, Apr. 27-30, 1993.
(Continued)

*Primary Examiner* — Vivian Chin
*Assistant Examiner* — Ammar Hamid

(57) ABSTRACT

An audio processing method and apparatus are described. In one embodiment, at least one first sub-band of a first audio signal is suppressed to obtain a reduced first audio signal with reserved sub-bands; suppressing at least one second sub-band of the at least one second audio signal to obtain at least one reduced second audio signal with reserved sub-bands; and mixing the reduced first audio signal and at least one reduced second audio signal. Alternatively, a first spatial
(Continued)

auditory property is assigned to a first audio signal so that the first audio signal may be perceived as originating from a first position. Alternatively, rhythmic similarity between at least two audio signals is detected, and time scaling is applied to an audio signal in response to relatively high rhythmic similarity between the audio signal and the other audio signal(s); and then at least two audio signals are mixed.

11 Claims, 9 Drawing Sheets

(51) Int. Cl.
*G10L 21/0364* (2013.01)
*H03G 5/00* (2006.01)
*G10L 25/87* (2013.01)

(58) Field of Classification Search
USPC ..... 381/27, 77, 80, 81, 2, 119, 309, 310, 17, 381/18, 74, 98, 94.1–94.3; 704/220, 278
See application file for complete search history.

(56) References Cited

U.S. PATENT DOCUMENTS

| | | | |
|---|---|---|---|
| 7,383,178 B2 | 6/2008 | Visser | |
| 7,391,877 B1 | 6/2008 | Brungart | |
| 8,015,002 B2 | 9/2011 | Li | |
| 2003/0081115 A1 | 5/2003 | Curry | |
| 2008/0253593 A1 | 10/2008 | Bramslow | |
| 2010/0017205 A1 * | 1/2010 | Visser | G10L 21/02 704/225 |
| 2011/0103591 A1 | 5/2011 | Ojala | |
| 2011/0112831 A1 | 5/2011 | Sorensen | |

OTHER PUBLICATIONS

So-Young Jeong et al., "Adaptive Noise Power Spectrum Estimation for Compact Dual Channel Speech Enhancement," International Conference on Acoustic, Speech, and Signal Processing 2010, IEEE, pp. 1630-1633, Mar. 14-19, 2010.

Richard L. Freyman et al., "The Role of Perceived Spatial Separation in the Unmasking of Speech," J. Acoustic Society Am. vol. 106, Issue 6, pp. 3578-3588, Aug. 13, 1999.

X. Jin and Z. Wang, "Speech Separation from Background of Music Based on Single-Channel Recording," The 18th International Conference on Pattern Recognition (ICPR'06), pp. 278-281, Sep. 18, 2006.

S. Ahn and H. Ko, "Background Noise Reduction Via Dual-Channel Scheme for Speech Recognition in Vehicular Environment," Consumer Electronic, 2005, ICCE, Digest of Technical Paper, pp. 461-462, Jan. 8-12, 2005.

A. Mouchtaris, "A Spectral Conversion Approach to Single-Channel Speech Enhancement," Audio, Speech, and Language Processing, IEEE Transaction, vol. 15, Issue 4, pp. 118-1193, May 1, 2007.

Thomas Wittkop et al., "Speech Processing for Hearing Aids: Noise Reduction Motivated by Models of Binaural Interaction," Acta Acustica, Editions de Physique Les Ulis Cedex, Fr, vol. 83, No. 4, pp. 684-699, Jan. 1, 1997.

Radfar, M.H. et al "Speaker-Independent Model-Based Single Channel Speech Separation" published in Journal Neurocomputing, vol. 72, Issue 1-3, Dec. 2008, pp. 71-78.

Duraiswami, R. et al "Processing of Reverberant Speech for Time-Delay Estimation" IEEE Transactions on Speech and Audio Processing, vol. 13, No. 6, Nov. 1, 2005, pp. 1110-1118.

* cited by examiner

AUDIO PROCESSING METHOD AND AUDIO PROCESSING APPARATUS

CROSS-REFERENCE TO RELATED APPLICATIONS

This application claims the benefit of priority to Chinese Patent Application No. 201210080868.8 filed on 23 Mar. 2012 and U.S. Provisional Patent Application No. 61/619,214 filed on 2 Apr. 2012, hereby incorporated by reference in their entireties.

TECHNICAL FIELD OF THE INVENTION

The present invention relates generally to audio signal processing. More specifically, embodiments of the present invention relate to audio processing methods and audio processing apparatus for improving speech intelligibility for one or more target talkers.

BACKGROUND OF THE INVENTION

With modern signal processing and telecommunication technology, target audio signals and background signals can be separated into multi-channel signals, or different signals in different directions or locations (such as different points in a room, or different signals from different cities) can be taken separately, mixed and transmitted to remote listeners. Current solution renders multi-talker speech sounds in different horizontal directions and mixes multi-channel speech signals into left and right channels so that listeners in the receiver side via stereo headphones or loudspeakers can perceive the locations of different speakers and understand desired speakers even if multiple people are talking simultaneously.

While more and more users have adopted stereo headphones or multi-channel sound reproduction systems to benefit from such spatialized speech communications, there are still a large number of users listening to sounds through mono-channel sound devices such as BlueTooth headsets and telephones. It is desirable to provide monoaural device users with the cues to separate different sound signals and understand the speech from target speakers among multiple simultaneous audio signals.

Even for listeners with multi-channel playback devices, if the original audio signal is created without spatial cues, or if multiple sound signals originate from almost the same position, it is desirable to provide the listeners with more cues to distinguish different sound signals.

SUMMARY OF THE INVENTION

According to an embodiment of the invention, an audio processing method is provided, comprising: suppressing at least one first sub-band of a first audio signal to obtain a reduced first audio signal with reserved sub-bands, so as to improve intelligibility of the reduced first audio signal, at least one second audio signal, or both the reduced first audio signal and the at least one second audio signal; suppressing at least one second sub-band of the at least one second audio signal to obtain at least one reduced second audio signal with reserved sub-bands; and mixing the reduced first audio signal and the at least one reduced second audio signal.

According to an embodiment of the invention, an audio processing method is provided as comprising: assigning a first audio signal at least one first spatial auditory property, so that the first audio signal may be perceived as originating from a first position relative to a listener.

According to an embodiment of the invention, an audio processing method is provided as comprising: detecting rhythmic similarity between at least two audio signals; applying time scaling to an audio signal in response to relatively high rhythmic similarity between the audio signal and the other audio signal(s); and mixing the at least two audio signals.

According to an embodiment of the invention, an audio processing method is provided as comprising: detecting onset of speech in at least two audio signals; delaying an audio signal in response to the onset of speech in the audio signal being the same as or close to that in another audio signal; and mixing the at least two audio signals.

According to an embodiment of the invention, an audio processing apparatus is provided as comprising: a spectral filter, configured to suppress at least one first sub-band of a first audio signal to obtain a reduced first audio signal with reserved sub-bands, and suppress at least one second sub-band of at least one second audio signal to obtain at least one reduced second audio signal with reserved sub-bands, so as to improve the intelligibility of the reduced first audio signal, the at least one reduced second audio signal, or both the reduced first audio signal and the at least one reduced second audio signal; and a mixer, configured to mix the reduced first audio signal and the at least one reduced second audio signal.

According to an embodiment of the invention, an audio processing apparatus is provided as comprising: a spatialization filter configured to assign a first audio signal at least one first spatial auditory property, so that the first audio signal may be perceived as originating from a first position relative to a listener.

According to an embodiment of the invention, an audio processing apparatus is provided as comprising: a rhythmic similarity detector configured to detect rhythmic similarity between at least two audio signals; a time scaling unit configured to apply time scaling to an audio signal in response to relatively high rhythmic similarity between the audio signal and the other audio signal(s); and a mixer configured to mix the at least two audio signals.

According to an embodiment of the invention, an audio processing apparatus is provided as comprising: a speech onset detector configured to detect onset of speech in at least two audio signals; a delayer configured to delay an audio signal in response to the onset of speech in the audio signal being the same as or close to that in another audio signal; and a mixer configured to mix the at least two audio signals.

BRIEF DESCRIPTION OF DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
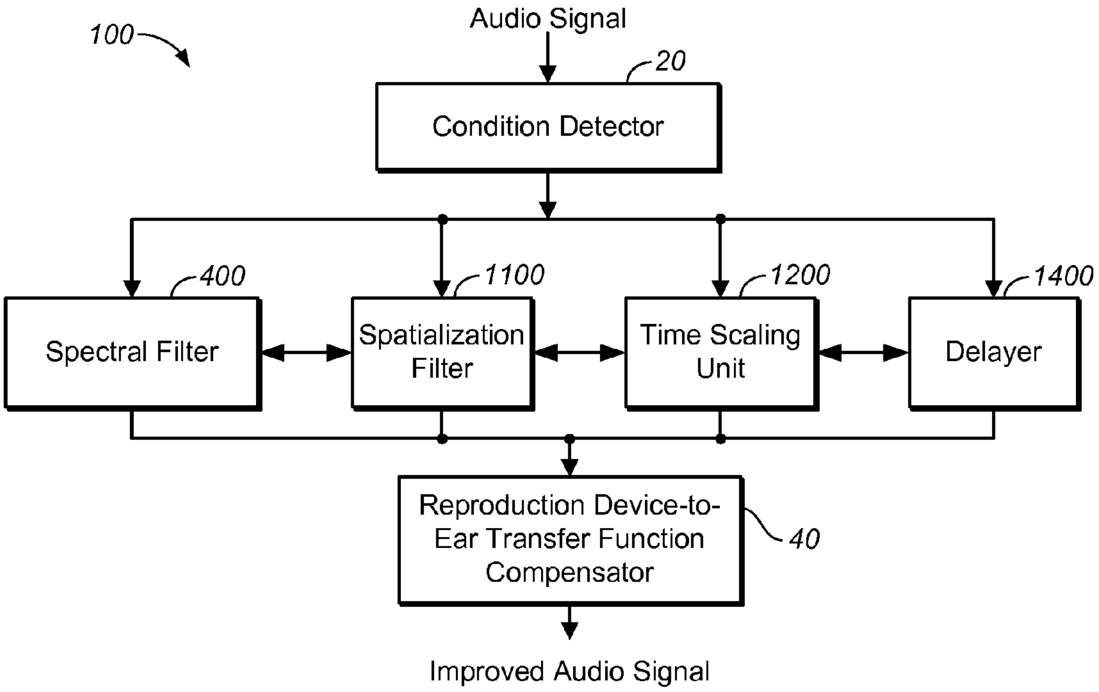
FIG. 1 is a block diagram illustrating an example audio processing apparatus 100 according to an embodiment of the invention.

The embodiments of the present invention are below described by referring to the drawings. It is to be noted that, for purpose of clarity, representations and descriptions about those components and processes known by those skilled in the art but not necessary to understand the present invention are omitted in the drawings and the description.

As will be appreciated by one skilled in the art, aspects of the present invention may be embodied as a system, a device (e.g., a cellular telephone, a portable media player, a personal computer, a server, a television set-top box, or a digital video recorder, or any other media player), a method or a computer program product. Accordingly, aspects of the present invention may take the form of an entirely hardware embodiment, an entirely software embodiment (including firmware, resident software, microcodes, etc.) or an embodiment combining software and hardware aspects that may all generally be referred to herein as a "circuit," "module" or "system." Furthermore, aspects of the present invention may take the form of a computer program product embodied in one or more computer readable mediums having computer readable program code embodied thereon.

Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic or optical signal, or any suitable combination thereof.

A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wired line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer as a stand-alone software package, or partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Overall Construction

FIG. 1 is a block diagram illustrating an example audio processing apparatus 100 according to an embodiment of the invention, which is also referred to as intelligibility improver 100 hereinafter.

Psychoacoustic studies have shown that speech intelligibility is affected significantly by energetic masking effect and informational masking effect of background signals to the target signals. Energetic masking effect relates to energy overlap between different speech signals in the same frequency band. Informational masking effect relates to listener's confusion caused by spatial and/or temporal overlap between different speech signals.

Therefore, according to an embodiment of the invention, it is proposed to improve speech intelligibility between different speech signals by any one of the following techniques or any combination thereof: minimizing energetic masking effect of background signals to the target signals as much as possible, and reducing the informational masking effect of background signals to the target signals as much as possible. Specifically, it is proposed to improve speech intelligibility between different speech signals by any one of the following techniques or any combination thereof: separating different speech signals in terms of frequency-bands (hereinafter "spectral separation"); spatially separating different speech signals (hereinafter "spatial separation"); and temporally separating different speech signals (hereinafter "temporal separation"). More specifically, temporal separation may include two aspects: shifting a speech signal as a whole (hereinafter "delay" or "time delaying"), and/or temporally scaling a speech signal, that is compressing or expanding an speech signal in time domain (hereinafter "time scaling").

Hence, as shown in FIG. 1, an audio processing apparatus according to an embodiment of the invention may comprise any one of a spectral filter 400, a spatialization filter 1100, a time scaling unit 1200 and a delayer 1400, or any combination thereof. Here, it may be assumed that each of the aforementioned devices receives time-domain speech signal as input, and outputs time-domain speech signal, although inside each of the devices frequency-domain processing may be involved. Then, the processing effects of the aforementioned devices may be simply combined with each other, as shown by the bi-directional arrows in FIG. 1. For simplicity of the drawing, only bi-directional arrows connecting immediately adjacent blocks are shown, but actually any two of the devices may be connected by such arrows, meaning that the processing effects of any two of the devices may be superimposed and combined with each other. Consequently, the sequence of the operations implemented by the devices is not important.

However, when one of the devices conducts a kind of processing such as frequency-domain processing and obtains a corresponding result, and an internal processing of another device needs such a result, then the other device may directly take the result from the one device as input. Such a situation shall be included when construing the meaning of FIG. 1 and any other drawings, as well as when construing the scope of protection of the appended claims.

Although selection and/or combination of the aforementioned devices may be arbitrary, such selection and/or combination may also be based on some conditions judged by users or automatically by e.g. a condition detector 20 as shown in FIG. 1. The conditions to be judged by users or by the condition detector 20 may include the number of speech signals, onset of a speech, similarity between speakers or speech signals, and so on.

Further, when spatial separation is used, then it is important to ensure that the spatial cues of each improved speech signal are not distorted during reproduction, so that the final listener can correctly perceive the spatial auditory properties assigned to the improved speech signal by the spatial separation (as will be discussed later). Then, in a variation of the embodiment, the intelligibility improver 100 may further comprise a reproduction device-to-ear transfer function compensator 40 to compensate for the distortion due to the device-to-ear response.

Theoretically, the compensator 40 may be positioned immediately after the spatialization filter 1100, or after all the operations of the spectral filter 400, the spatialization filter 1100, the time scaling unit 1200 and the delayer 1400.

Figure 2:
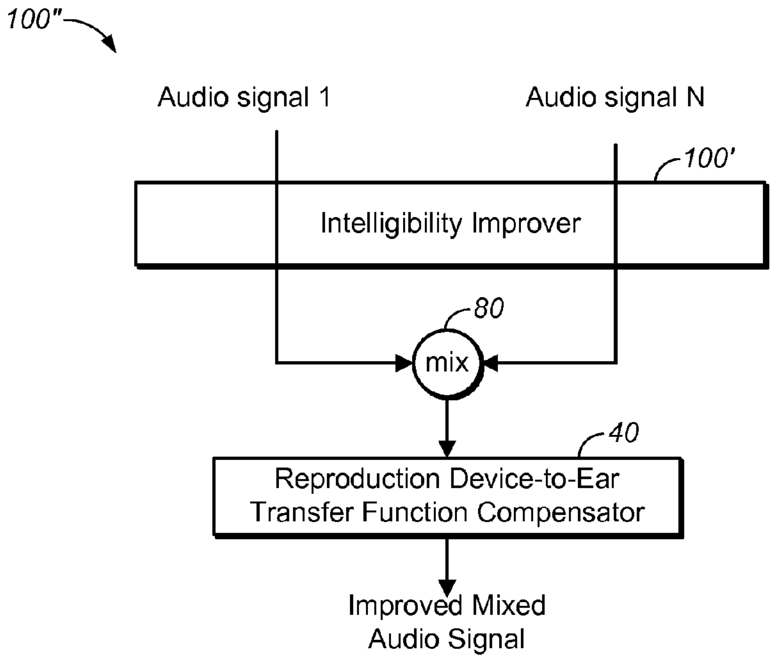
FIG. 2 is a block diagram illustrating a variation of the example audio processing apparatus 100.

For clarity of the drawing, FIG. 1 shows only one audio signal as input, and the scenario of multiple audio signal inputs is shown in FIG. 2, in which a first variation 100' of the audio processing apparatus is shown. As discussed before, the audio processing apparatus 100' may have no compensator 40, which may be placed outside of the audio processing apparatus 100', as shown in FIG. 2, or may be just removed.

Also shown in FIG. 2 is a second variation of the audio processing apparatus 100" comprising the variation of 100' plus a mixer 80. That is, if there are multiple audio signal inputs, such as N inputs (N is an integer equal to or greater than 2), then after being improved by the audio processing apparatus 100', the multiple improved audio signals may be mixed into a mono-channel signal by the mixer 80. As discussed before, the compensator 40 may be placed before or after the mixer 80, or may be just cancelled.

From the description above, a skilled in the art will understand that corresponding audio processing methods are also disclosed. The details of each component of the audio processing apparatus and each step of the audio processing methods will be discussed later.

Throughout the disclosure, it shall be appreciated that speech signal (or voice signal) is just a kind of audio signal. Although the embodiments of the invention may be used to improve intelligibility of multiple speech signals transmitted in mono-channel, they are not limited to speech signal and instead they may be used to improve intelligibility of other kinds of audio signals. Therefore, throughout the disclosure the term "audio signal" is used, and the term "speech signal" and/or "voice signal" are used only when necessary.

Spectral Separation

Below will be discussed embodiments of the audio processing apparatus and embodiments of the audio processing method implementing spectral separation, with reference to FIGS. 3-8.

According to an embodiment of the invention, an audio processing method comprises suppressing at least one first sub-band of a first audio signal to obtain a reduced first audio signal with reserved sub-bands, so as to improve intelligibility of the reduced first audio signal, at least one second audio signal, or the reduced first audio signal and the at least one second audio signal. Correspondingly, an embodiment of the audio processing apparatus comprises a spectral filter 400 configured to suppress at least one first sub-band of a first audio signal to obtain a reduced first audio signal with reserved sub-bands, so as to improve the intelligibility of the reduced first audio signal, at least one second audio signal, or the reduced first audio signal and the at least one second audio signal.

Psychoacoustic studies show that human auditory system can have responses to sounds with frequencies between 20 Hz and 20 KHz, and that difference between frequency distributions of different audio signals will help a listener to distinguish and track different audio signals. Therefore, the embodiment aims to improve intelligibility of multiple audio signals by passing them through different frequency bands. In other words, each processed audio signal is not in its full audible frequency band, but reduced into some reserved sub-bands.

Figure 3:
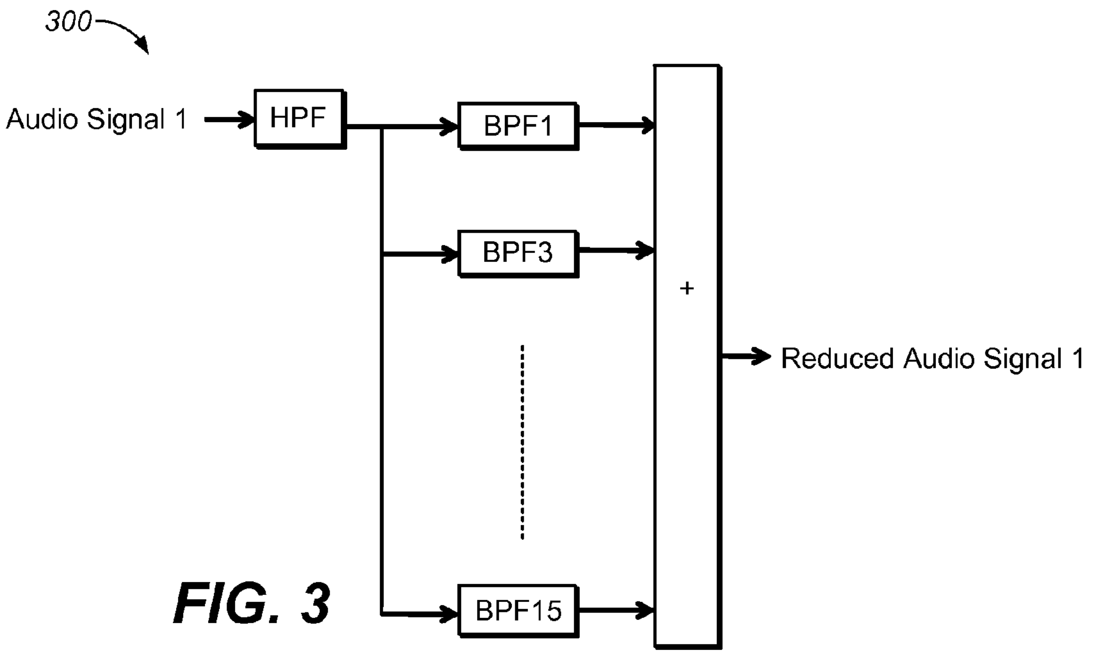
FIG. 3 is a block diagram illustrating an example audio processing apparatus implementing spectral separation according to another embodiment of the invention.

Suppressing of sub-bands may be realized by many existing or future techniques. As an example, FIG. 3 is a block diagram illustrating an embodiment 300 of audio processing apparatus, which may be also referred to as a spectral filter 400 and may be embodied as a bank of band pass filters (BPFs) possibly preceded by a high pass filter (HPF) for filtering low frequency interference (such as lower than 200 Hz). The BPFs may be ⅓ octave, fourth-order Butterworth IIR (infinite impulse response) filters, but not limited thereto. As shown in FIG. 3, it is assumed that the full audible frequency band is divided into 16 evenly-distributed sub-bands and it is intended to reduce audio signal 1 into half of the sub-bands. Then, we may use 8 BPFs (BFP1, BPF3, . . . , BFP15) corresponding respectively to 8 pass bands (that is reserved sub-bands of the expected output audio signal) to filter the audio signal, so that in each BPF only the pass band is reserved and the other sub-bands are suppressed. The outputs of the 8 BPFs are added together so that the resultant output (reduced audio signal 1) contains 8 pass bands, with the other 8 sub-bands suppressed.

Returning to FIG. 2, in the scenario where there are multiple input audio signals, say two, we may use another bank of BPFs (not shown in the drawings) to filter the second audio signal. For example, it is assumed again that the full audible frequency band is divided into 16 evenly-distributed sub-bands, and that the first audio signal is reduced into 8 odd-numbered sub-bands, then the second audio signal may be reduced into 8 even-numbered sub-bands.

Then, it could be seen another embodiment of the audio processing method is provided as comprising: suppressing at least one first sub-band of a first audio signal to obtain a reduced first audio signal with reserved sub-bands so as to improve intelligibility of the reduced first audio signal, at least one second audio signal, or the reduced first audio signal and the at least one second audio signal; suppressing at least one second sub-band of the at least one second audio signal to obtain at least one reduced second audio signal with reserved sub-bands; and mixing the reduced first audio signal and the at least one reduced second audio signal.

Note that when mixing the reduced first audio signal and the at least one reduced second audio signal, the resultant audio signal may be on mono-channel or multi-channel.

In addition to BPF bank 300, the spectral filter 400 may be implemented by other means. For example, each audio signal may be first transformed as frequency-domain signal, such as by FFT (Fast Fourier Transform), then the frequency-domain signal may be processed by removing or suppressing some sub-bands, then be transformed as time-domain signal, such as by inverse FFT.

Whatever form is adopted as the spectral filter 400, it may be implemented as programmable circuit, software, firmware and the like. Therefore, in the audio processing apparatus in an embodiment, each audio signal may be provided with a spectral filter 400, or the same spectral filter may be provided for all the audio signals, and may be designed to suppress different sub-bands for different audio signals. Therefore, according to an embodiment, an audio processing apparatus is provided as comprising a spectral filter, configured to suppress at least one first sub-band of a first audio signal to obtain a reduced first audio signal with reserved sub-bands, and suppress at least one second sub-band of at least one second audio signal to obtain at least one reduced second audio signal with reserved sub-bands, so as to improve the intelligibility of the reduced first audio signal, the at least one reduced second audio signal, or both the reduced first audio signal and the at least one reduced second audio signal. The audio processing apparatus may further comprise a mixer configured to mix the reduced first audio signal and the at least one reduced second audio signal, either into mono-channel or multi-channel.

Figure 6:
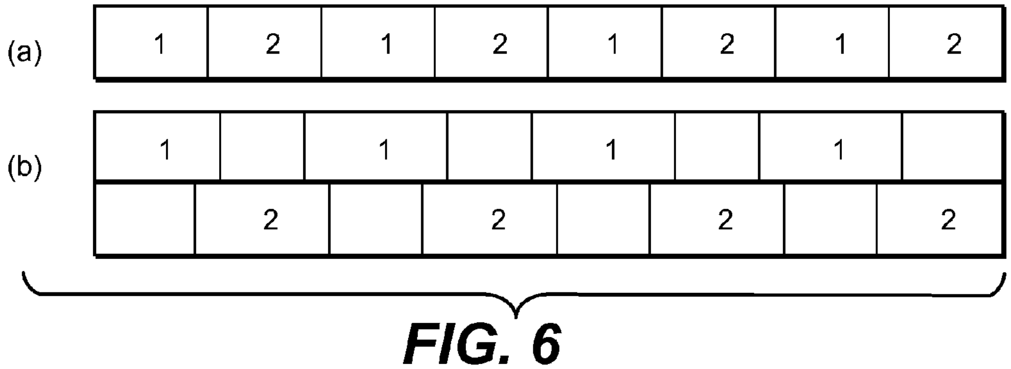
FIG. 6 is a diagram illustrating an exemplary scheme for allocating reserved sub-bands to audio signals.

How to allocate reserved sub-bands to multiple audio signals will affect to what extent the intelligibility of the audio signals may be improved. Generally, it is required to separate the reserved sub-bands of different audio signals as clear as possible, that is, the reserved sub-bands of different audio signals are totally different, not overlapping each other (as shown in FIG. 6(*a*) and the upper line in FIG. 7, wherein slots "1" and "2" indicate sub-bands for audio signal 1 and audio signal 2, respectively), even with gaps between the sub-bands of different audio signals (not shown in the drawings).

On the other hand, suppressing some sub-bands of an audio signal implies the audio quality will be degraded to some extent, and a proper allocation scheme shall be assured to avoid significant degradation of audio quality. For example, it is preferred to make each audio signal cover both low frequency sub-bands and high frequency sub-bands. Another example, if the number of speakers/audio signals to be separated is too large, it might be improper to allocate to each audio signal too few or too narrow reserved sub-bands. In such a situation, the reserved sub-bands for different audio signals may be allowed to overlap each other (as shown in FIG. 6(*b*), wherein "1" indicates sub-bands for audio signal 1, and "2" indicates sub-bands for audio signal 2), but as little as possible; or, some audio signals, especially those relatively important audio signals, may be allocated to significantly broader sub-bands (as shown in upper line in FIG. 7, wherein audio signal 1 is more important than audio signal 2), even the full band if the audio signal is the most important (as shown in lower line in FIG. 7: audio signal 3 is the most important).

Figure 7:
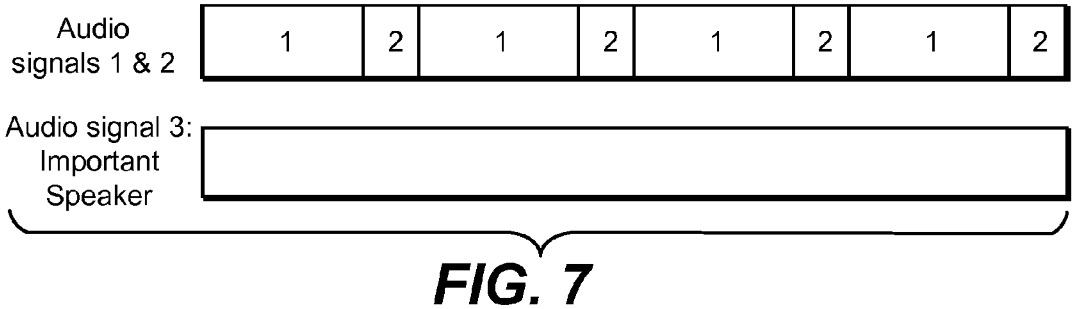
FIG. 7 is another diagram illustrating an exemplary scheme for allocating reserved sub-bands to audio signals.

How many audio signals the audio processing method and apparatus of the embodiment can process, and how to allocate the reserved sub-bands to each audio signal, can be preset in an embodiment. For example, for each audio signal, the reserved sub-bands may be distributed evenly across the full band of the audio signals, as shown in FIG. 6 and FIG. 7 (audio signal 1 and audio signal 2). And between different audio signals, the reserved sub-bands of different audio signals may be interleaved, also as shown in FIG. 6 and FIG. 7 (audio signal 1 and audio signal 2), and preferably interleaved with each other evenly. And the audio processing apparatus may be configured correspondingly.

Figure 4:
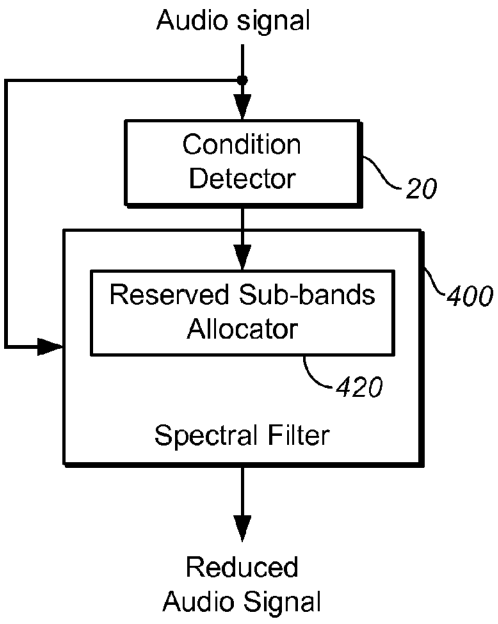
FIG. 4 is a block diagram illustrating an example audio processing apparatus implementing spectral separation according to yet another embodiment of the invention.

In another embodiment, the audio processing method and apparatus may be configured in real time depending on specific situation. FIG. 4 is a block diagram illustrating such an example audio processing apparatus implementing spectral separation. The apparatus shown in FIG. 4 is in fact a part of FIG. 1 and comprises the condition detector 20 and the spectral filter 400, with the spectral filter 400 comprising a reserved sub-bands allocator 420, which determines a scheme of allocating reserved sub-bands to each audio signal according to the conditions detected by the condition detector 20, and configures the spectral filter 400 accordingly.

Depending on specific situations, the condition detector 20 may function as, or be configured as, or comprise a speaker/audio signal number detector (not shown), an infrastructure capacity/traffic detector (now shown), a speaker/audio signal importance detector (not shown), or a speaker similarity detector (not shown), or any combination of these detectors. According to the conditions detected by the condition detector 20, the reserved sub-bands allocator may decide whether or not to filter an audio signal, and how many and how wide sub-bands may be allocated to an audio signal, and configure the spectral filter 400 accordingly. Then the spectral filter 400 as configured by the reserved sub-bands allocator 420 filters respective audio signal(s) accordingly.

When the condition detector 20 functions as a speaker/audio signal number detector, the reserved sub-bands allocator 420 may be configured to determine the width and the number of reserved sub-bands to be allocated to each audio signal based on the number of speakers/audio signals. Generally, a speaker corresponds to an audio signal. However, in a scenario where there are multiple audio signal inputs, with each audio signal input comprising multiple speakers, then the number of speakers is not equal to the number of audio signals. In such a case, either speaker number or audio signal number or both may be considered. For other embodiments or variants in this disclosure, the situation is the same and detailed description will be omitted below. When differentiating different speakers, blind signal separation (BSS) techniques may be used, as discussed later.

For example, if the number is relatively small, say 2, then the reserved sub-bands for all the audio signals may be distributed evenly across the full band, and the reserved sub-bands for different audio signals may be interleaved without overlapping each other, as shown in FIG. 6(*a*). If the number is relatively large, then overlap of reserved sub-bands of different audio signals may be allowed to some extent, as shown in FIG. 6(*b*).

Figure 5:
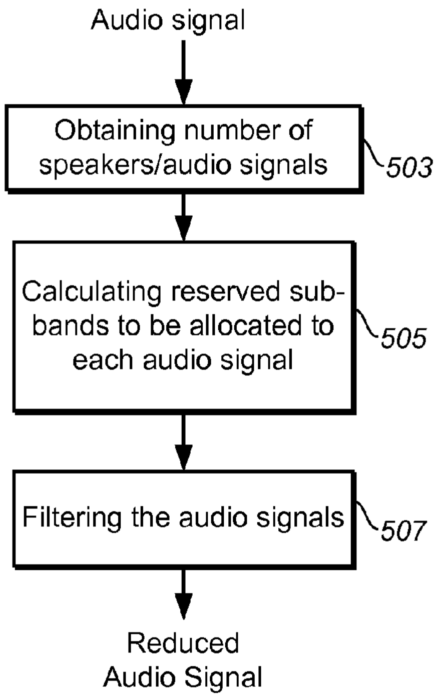
FIG. 5 is a flow chart illustrating an example audio processing method implementing spectral separation according to an embodiment of the invention.

Corresponding to the audio processing apparatus discussed above, also provided is an embodiment of the audio processing method, as shown in FIG. 5. That is, the method may further comprise a step of obtaining number of speakers/audio signals (Step 503), and a step of allocating reserved sub-bands to each audio signal (Step 505), with the width and the number of reserved sub-bands for each audio signal being determined based on the number of speakers/audio signals. Then the audio signals may be filtered accordingly (Step 507), thus suppressing the sub-bands other than the reserved sub-bands for each audio signal.

When the condition detector 20 functions as an infrastructure capacity/traffic detector, the reserved sub-bands allocator 420 may be further configured to allocate more and/or broader reserved sub-bands, or a full band to an audio signal, in response to relatively high capacity and/or relatively low traffic in infrastructure related to the audio signal. Here the infrastructure related to the audio signal includes the audio processing apparatus (such as a server, or a audio input terminal such as a telephone), and the link (such as network) carrying the intermediate audio signal and the final processed audio signal. On one hand, implementing the spectral separation processing will occupy some computing resources, thus when the load of the audio processing apparatus is high, the spectral filtering strength may be lowered down, that is, more and/or broader sub-bands or even the full band may be reserved for some or all of the audio signals. On the other hand, spectral filtering helps reduce data traffic. So, when traffic on the links such as network is high, it is necessary to make stronger spectral filtering.

Corresponding to the audio processing apparatus discussed above, also provided is an embodiment of the audio processing method. That is, the method may further comprise a step of acquiring capacity and/or traffic information of infrastructure carrying the audio signals; and correspondingly, the allocating step may be configured to allocate more and/or broader reserved sub-bands, or a full band to an audio signal, in response to relatively high capacity and/or relatively low traffic in infrastructure related to the audio signal.

When the condition detector 20 functions as a speaker/audio signal importance detector, the reserved sub-bands allocator 420 may be further configured to allocate more and/or broader reserved sub-bands, or a full band to a speaker/audio signal, in response to relatively high importance of the corresponding speaker/audio signal. As discussed before, reducing some sub-bands of an audio signal will degrade the quality of the audio signal. So, when a speaker is important, it is natural to transmit and reproduce the audio signal carrying the voice of the important speaker as it is. The speaker/audio signal importance detector may be configured to just receive an external instruction indicating whether the concerned audio signal is important or not. For example, the audio source (such as a telephone or a microphone) may be provided with a button switched manually between "important" state and "not important" state, and in response to the switching of the button, the audio processing apparatus (the audio source or a server) treat the corresponding audio signal as important or not important. The speaker/audio signal importance detector may also be configured to determine the importance of an audio signal by detecting amplitude and/or appearing frequency of speech in each audio signal. Generally, if a speaker talks louder than the others, or if in an audio signal, the speaker talks much more than the others (in a certain period), then the speaker must be more important at least in the certain period. About detection of appearance of a speech, many techniques may be used, such as a voice activity detector (VAD) as will be discussed later in the part "Temporal Separation".

Corresponding to the audio processing apparatus discussed above, also provided is an embodiment of the audio processing method. That is, the method may further comprise a step of acquiring importance information of the speakers/audio signals; and correspondingly, the allocating step may be configured to allocate more and/or broader reserved sub-bands, or a full band to a speaker/audio signal, in response to relatively high importance of the corresponding speaker/audio signal.

When the condition detector 20 functions as a speaker similarity detector, the reserved sub-bands allocator 420 may be further configured to allocate more and/or broader reserved sub-bands, or a full band to a speaker/audio signal, in response to relatively low speaker similarity between the audio signal and the other audio signal(s). As discussed before, capacity of and traffic on relevant infrastructure as well as audio quality are important factors to be considered. So, if voices of two speakers themselves can be easily distinguished (such as a male speaker and a female speaker whose voices are obviously different from each other to provide enough speaker cues for listeners to understand speech signals) and the other conditions allow, then it is not necessary to do spectral separation processing aiming to distinguishing the two speakers. Speaker similarity relates to the characteristics of voices of speakers, and thus speaker similarity may be evaluated through voice/speaker recognition techniques. Speaker similarity may also be obtained through other means, such as through comparing rhythmic structures of different audio signals, as discussed later in the part "Temporal Separation".

Figure 8:
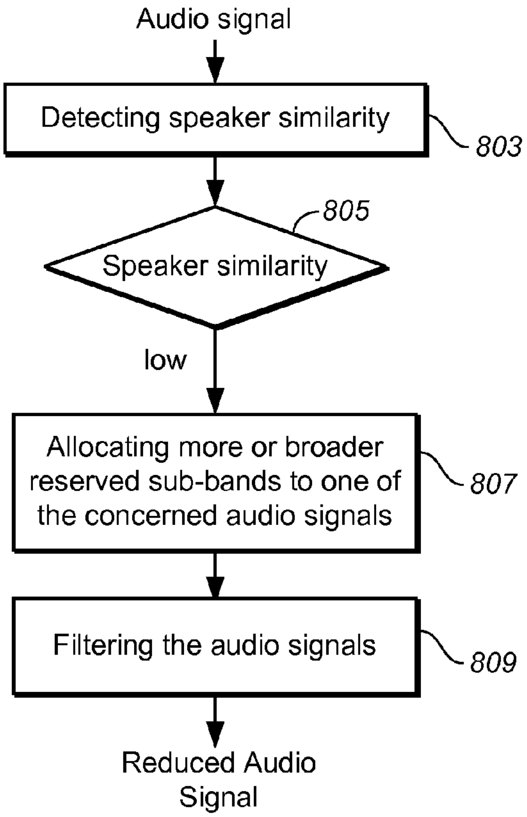
FIG. 8 is a flowchart illustrating a variation of the embodiment shown in FIG. 5.

Corresponding to the audio processing apparatus discussed above, also provided is an embodiment of the audio processing method, as shown in FIG. 8. That is, the method may further comprise a step of detecting speaker similarity between different audio signals (Step 803). And correspondingly, the allocating step may be further configured to allocate more and/or broader reserved sub-bands, or a full band to an audio signal (Step 807), in response to relatively low speaker similarity between the audio signal and the other audio signal(s) (Step 805). Then the audio signals may be filtered accordingly (Step 809), thus suppressing the other sub-bands than the reserved sub-bands for each audio signal.

The following is a set of experimental data showing the effect of spectral separation on the understanding of a closed-set vocabulary speech (target speech) with background noise or speech:

| Masker type | Understanding Rate |
|---|---|
| Different band noise | 91.25% |
| Different band speech | 54.88% |
| Same band noise | 69.51% |
| Same band speech | 42.86% |

The experimental data is obtained when target speech and background noise/speech are in the same direction. The experimental data show that when background noise is in different frequency band from the target speech, the understanding rate is 91.25%; when background speech is in different frequency band from the target speech, the understanding rate is 54.88%; when the background noise is in the same frequency band as the target speech, the understanding rate is 69.51%; and when the background speech is in the same frequency band as the target speech, the understanding rate is 42.86%.

Then it could be seen that the effect of spectral separation is 54.88%-42.86%=12.2%, or 87.81%-73.75%=14.06%, proving spectral separation is effective.

Spatial Separation

Below will be discussed embodiments of the audio processing apparatus and embodiments of the audio processing method implementing spatial separation, with reference to FIGS. 9-11.

As discussed in the part "Overall Construction", spatial separation helps release the informational masking, and reduce the listening effort of understanding speech. According to an embodiment of the invention, an audio processing method comprises assigning a first audio signal at least one first spatial auditory property, so that the first audio signal may be perceived as originating from a first position relative to a listener. Correspondingly, an embodiment of the audio processing apparatus comprises a spatialization filter 1100 configured to assign a first audio signal at least one first spatial auditory property, so that the first audio signal may be perceived as originating from a first position relative to a listener.

Returning to FIG. 2, in the scenario where there are multiple input audio signals, say two, we may assign the two audio signals different spatial auditory properties so that they sound originating from different positions. Then another embodiment of the audio processing method is provided as comprising: assigning a second audio signal at least one second spatial auditory property, so that the second audio signal may be perceived as originating from a second position different from the first position; and mixing the first audio signal and the second audio signal. Correspondingly, in the audio processing apparatus the spatialization filter may be further configured to assign a second audio signal at least one second spatial auditory property, so that the second audio signal may be perceived as originating from a second position different from the first position; and the audio processing apparatus may further comprise a mixer configured to mix the first audio signal and the second audio signal.

The spatialization filter may be based on HRTF (Head-Related Transfer Function), which means due to the effect of the head and the external ear, sounds from different directions will cause different response in the inner ear.

Psychoacoustic research has revealed that besides the relationship between ITD (Inter-aural Time Difference), IID (Inter-aural Intensity Difference) and perceived spatial location, HRFT may also be used to predict perceived spatial location. HRTF is defined as the sound pressure impulse response at a point of the ear cannel of a listener, normalized with respect to the sound pressure at the point of the head center of the listener when the listener is absent. FIG. 9 contains some relevant terminology, and depicts the spatial coordinate system used in much of the HRTF literature, and also in the disclosure.

Figure 9:
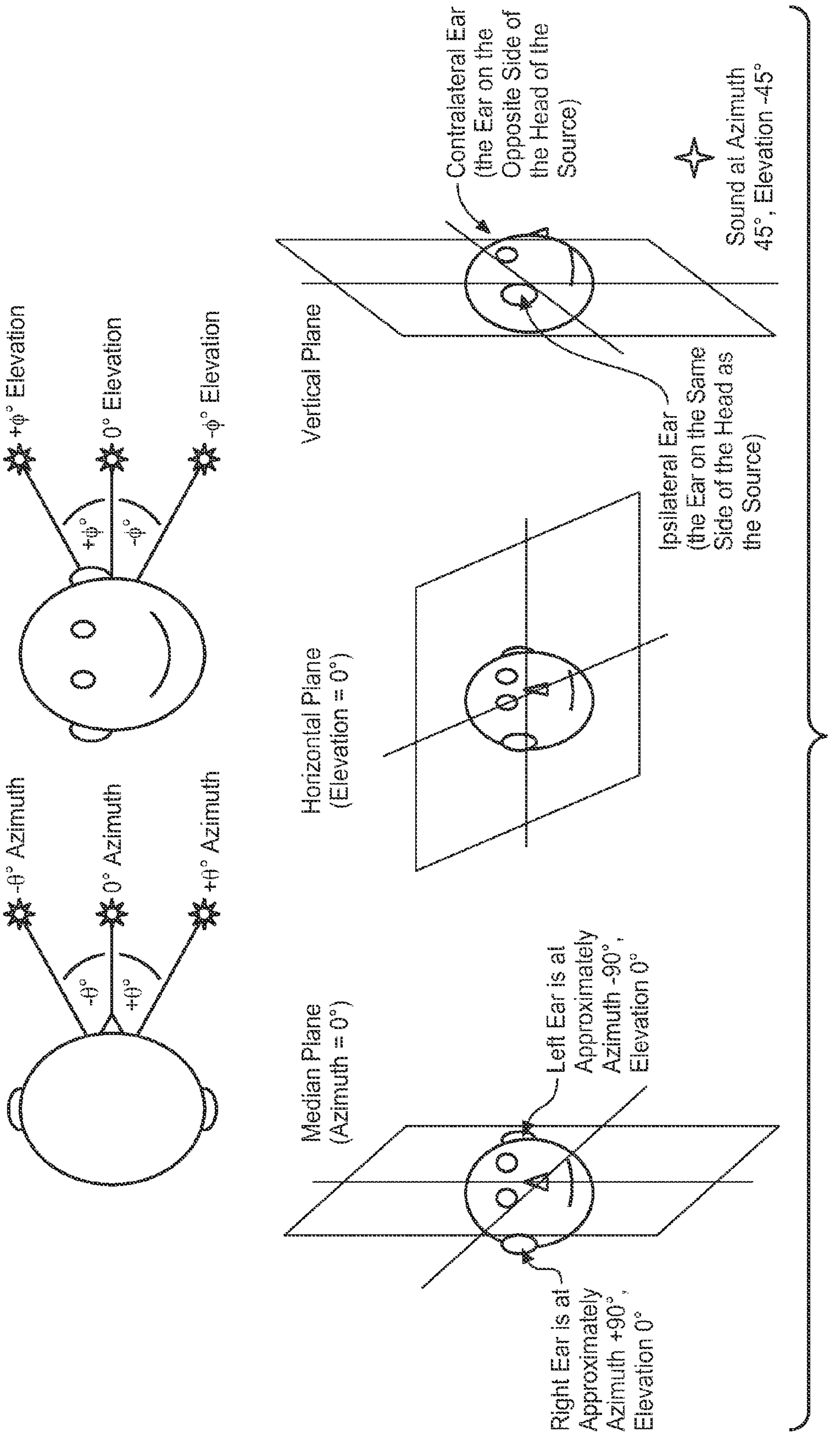
FIG. 9 is a diagram illustrating spatial coordinate system and terminology used in an example audio processing method according to an embodiment of the invention.

As shown in FIG. 9, azimuth indicates sound source's spatial direction in a horizontal plane, the front direction (in a median plane passing the nose and perpendicular to a line connecting both ears) is 0 degree, the left direction is 90 degrees and the right direction is −90 degrees. Elevation indicates sound source's spatial direction in up-down direction. If azimuth corresponds to longitude on the Earth, then elevation corresponds to latitude. A horizontal plane passing both ears corresponds to an elevation of 0 degree, the top of head corresponds to an elevation of 90 degrees.

Research revealed that perception of azimuth (horizontal position) of a sound source mainly depends on IID and ITD, but also depends on spectral cues to some extent. While for perception of elevation of a sound source, the spectral cues, thought to be contributed from the pinnae, play an important role. Psychoacoustic research even revealed that elevation localization, especially in median plane, is fundamentally a monaural process.

Figure 10:
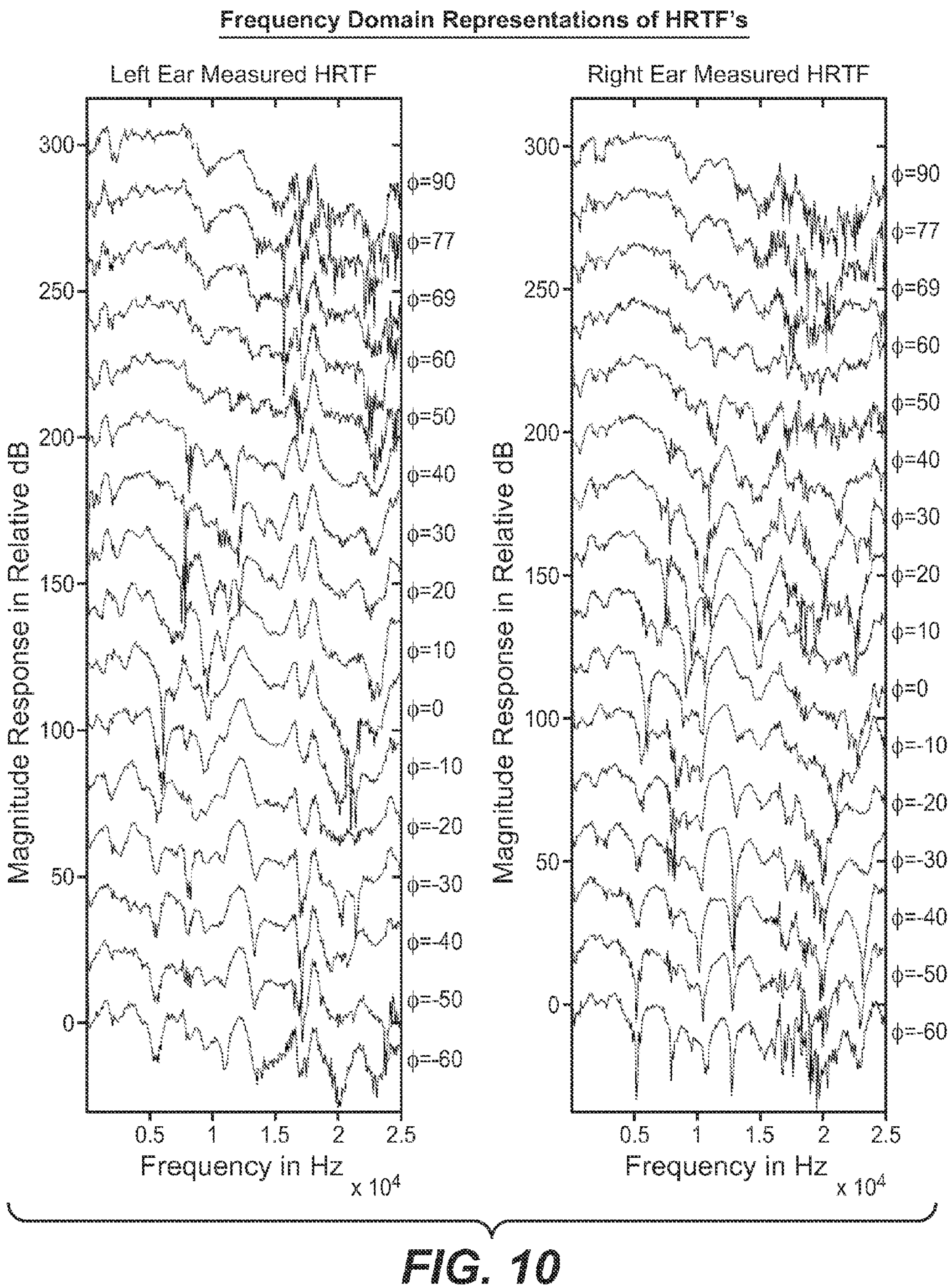
FIG. 10 is a diagram illustrating the frequency responses of spatial filters possibly used in an example audio processing method according to an embodiment of the invention.
Figure 11:
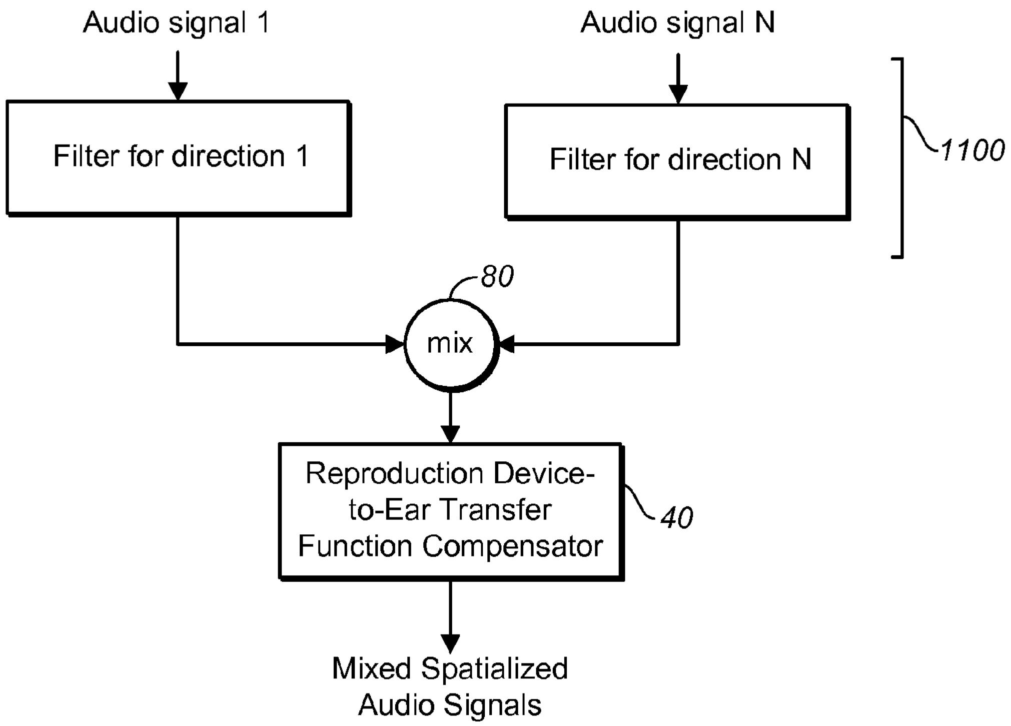
FIG. 11 is a block diagram illustrating an example audio processing apparatus implementing spatial separation according to an embodiment of the invention.

FIG. 10 illustrates frequency domain representations of HRTF's as a function of elevation in the median plane (azimuth=0°). There is a notch at 7 kHz that migrates upward in frequency as elevation increases. There is also a shallow peak at 12 kHz which "flattens out" at higher elevations. These noticeable patterns in HRTF data imply cues correlated with the perception of elevation. Of course the notch at 7 kHz and the shallow peak at 12 kHz are just examples for possible elevation cues. In fact, psychoacoustic perception of human being's brain is a very complex process not fully understood up to now. But generally the brain has always been trained by its experience and the brain has correlated each azimuth and elevation with specific spectral response. So, when simulating a specific spatial direction of a sound source, we may just "modulate" or filter the audio signal from the sound source with the HRTF data.

For example, when simulating a sound source in the median plane (that is azimuth=0 degree) with an elevation of 0 degree, we may use the spectrum corresponding to $\phi=0$ illustrated in FIG. 10 to filter the audio signal. As mentioned before, spectrum response may also contain azimuth cues. Therefore, through the filtering we may assign an audio signal both azimuth and elevation cues.

Knowing that each spatial direction (a specific pair of azimuth and elevation) corresponds to a specific spectrum, it may be regarded that each spatial direction corresponds to a specific spatial filter. So, in the scenario of FIG. 2 where there are multiple audio signals, we can understand the spatial filter 1100 as comprising multiple filters for multiple directions, as shown in FIG. 11.

Note that when mixing the multiple spatialized audio signals, the resultant audio signal may be on mono-channel or multi-channel.

As discussed before, the azimuth/elevation cues lie in the spectrum response at the ear. So, it is very important for the spectrum pattern of the audio signal to be maintained during transmission and reproduction. However, in sound reproduction, the spatial cues may be distorted by a device-to-ear transfer function specific to a reproduction device. Therefore, for achieving better perceived spatialization effect, it would be better to compensate for the device-to-ear transfer function specific to the reproduction device.

Thus, according to an embodiment of the invention, the audio processing method may further comprise compensating for a device-to-ear transfer function specific to a reproduction device, either before or after the mixing step. Correspondingly, the audio processing apparatus according to an embodiment may further comprise a compensator configured to compensate for the device-to-ear transfer function specific to the reproduction device.

When the compensation is conducted after the mixing operation, it may be conducted in the final listener's reproduction device. For example, when headphones are used by the final listener, then the reproduction device may comprise a filter to compensate for a device-to-ear transfer function specific to the headphones. If it is a pair of earphones, then a different device-to-ear transfer function specific to the earphones needs to be compensated. If neither headphones nor earphones are used and the audio signal is reproduced directly with a loudspeaker, then the transfer function from the loudspeaker to the listener ear shall be compensated. At the reproduction device, the user may select which compensation method to apply, but the reproduction device may also detect what's the output device and determine a proper compensation method automatically.

Similar to the discussion in the part "Spectral Separation", the spatial separation is not necessarily to be used in each scenario. When infrastructure capacity is low and/or the infrastructure traffic is high, the spatial separation may be switched off to save infrastructure resource; when a speaker is important, the spatial separation may also be switched off to feed the audio signal directly to the mixer, and the expected listening experience is that the important speaker is perceived as closer to the listener (or in-head) than other spatialized speech signals.

For the above purpose, the audio processing apparatus may use the same infrastructure capacity/traffic detector and/or speaker/audio signal importance detector (that is the condition detector 20) as in the embodiments discussed in the part "Spectral Separation", or another similar condition detector.

When the condition detector 20 functions as an infrastructure capacity/traffic detector, the spatialization filter may be further configured to be disabled with respect to an audio signal in response to relatively low capacity and/or relatively high traffic in infrastructure related to the audio signal. Here the infrastructure related to the audio signal includes the audio processing apparatus (such as a server, or a audio input terminal such as a telephone), and the link (such as network) carrying the intermediate audio signal and the final processed audio signal. Corresponding to the audio processing apparatus discussed above, also provided is an embodiment of the audio processing method. That is, the method may further comprise a step of acquiring capacity and/or traffic information of infrastructure carrying the audio signals; and correspondingly, the allocating step may be configured to be disabled with respect to an audio signal in response to relatively low capacity and/or relatively high traffic in infrastructure related to the audio signal.

When the condition detector 20 functions as a speaker/audio signal importance detector, the spatialization filter may be further configured to be disabled with respect to an audio signal in response to relatively high importance of the corresponding speaker/audio signal. The speaker/audio signal importance detector may be configured to just receive an external instruction indicating whether the concerned audio signal is important or not. For example, the audio source (such as a telephone or a microphone) may be provided with a button switched manually between "important" state and "not important" state, and in response to the switching of the button, the audio processing apparatus (the audio source or a server) treat the corresponding audio signal as important or not important. The speaker/audio signal importance detector may also be configured to determine the importance of an audio signal by detecting amplitude and/or appearing frequency of speech in each audio signal. Generally, if a speaker talks louder than the others, or if in an audio signal, the speaker talks much more than the others (in a certain period), then the speaker must be more important at least in the certain period. About detection of appearance of a speech, many techniques may be used, such as a voice activity detector as will be discussed later in the part "Temporal Separation".

Corresponding to the audio processing apparatus discussed above, also provided is an embodiment of the audio processing method. That is, the method may further comprise a step of acquiring importance information of the speakers/audio signals; and correspondingly, the allocating step may be configured to be disabled with respect to an audio signal in response to relatively high importance of the corresponding speaker/audio signal.

As discussed in the "Overall Construction", spatial separation may be combined with spectral separation. Therefore, all the embodiments/variations discussed in the part "Spatial Separation" may be combined with all the embodiments in the part "Spectral Separation". Spectral separation or spatial separation or their combination has good effect of improving intelligibility.

Temporal Separation

Below will be discussed embodiments of the audio processing apparatus and embodiments of the audio processing method implementing temporal separation, with reference to FIGS. 12-15.

In psychophysics, auditory scene analysis (ASA) is the process by which the human auditory system organizes sound into perceptually meaningful elements. It is known that temporal cues, such as onset and rhythm, play key roles in grouping and streaming for speech recognition in a multi-talker mixture. Therefore, in embodiments of the invention, it is proposed to conduct temporal separation to increase temporal dissimilarity among competing talkers through altering the temporal aspect of each talker, thus avoiding the perceptual integration of interfering talkers.

Figure 12:
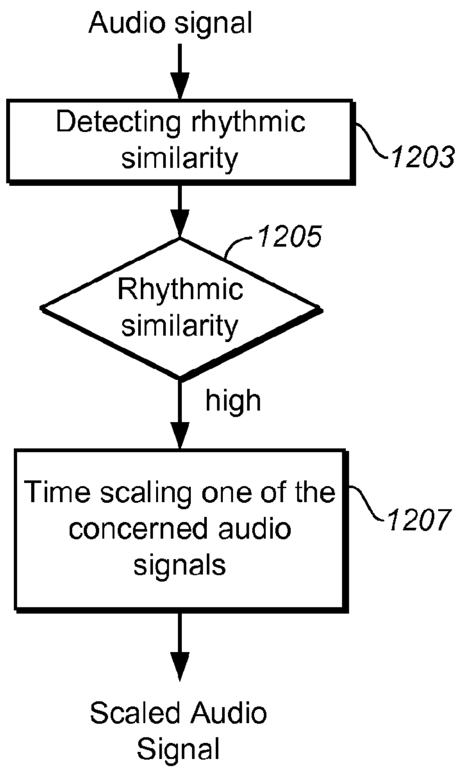
FIG. 12 is a flowchart illustrating an example audio processing method implementing time scaling according to an embodiment of the invention.

In an embodiment as shown in FIG. 12, an audio processing method is provided as comprising: detecting rhythmic similarity between at least two audio signals (Step 1203); applying time scaling to an audio signal (Step 1207) in response to relatively high rhythmic similarity between the audio signal and the other audio signal(s) (Step 1205); and mixing the at least two audio signals (not shown in FIG. 12). According to the embodiment, if two input speech signals have similar rhythmic structure, time scaling may be applied to one or both of the input signals before mixing such that an increased temporal dissimilarity is achieved.

Correspondingly, also provided is an audio processing apparatus comprising: a rhythmic similarity detector configured to detect rhythmic similarity between at least two audio signals; a time scaling unit configured to apply time scaling to an audio signal in response to relatively high rhythmic similarity between the audio signal and the other audio signal(s); and a mixer configured to mix the at least two audio signals.

Here, the rhythmic similarity detector may be implemented as the aforementioned condition detector 20 or a part thereof, or a separate component.

Rhythmic similarity detection may comprise simple correlation analysis by computing cross-correlation between two input audio streams. Two audio segments are determined as similar if the correlation therebetween is high. Alternatively, rhythmic similarity detection may comprise beat/pitch accent detection which identifies strong energy segments. If pitch accents from two input streams occur at the same time (overlap in time), the segments are determined as similar.

Figure 13A:
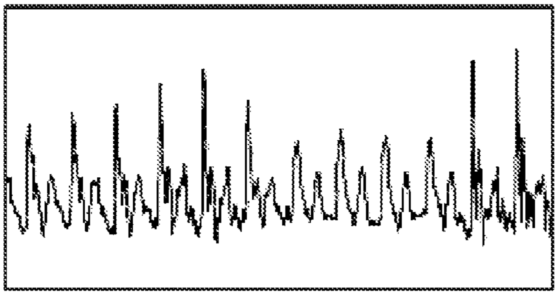
FIG. 13 is spectrum examples illustrating the effect of time scaling.
Figure 13B:
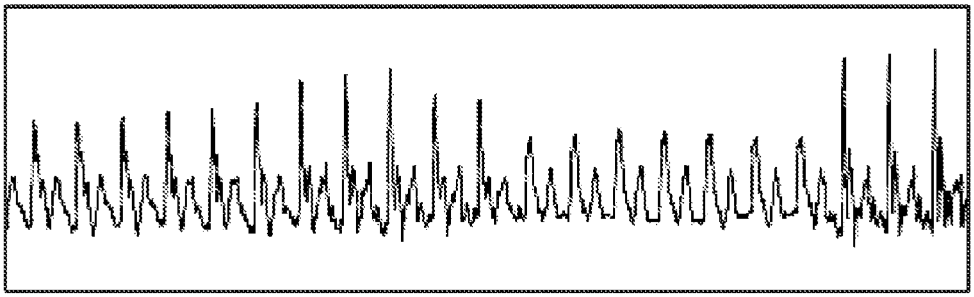

Many time scaling techniques, for example, Overlap-add (OLA) synthesis technique, the synchronized overlap-add (SOLA) method, or the WSOLA (Overlap-add Techniques based on Waveform Similarity) can be applied here, see W. Verhelst, M. Roelands, 1993, An Overlap-Add Technique based on Waveform Similarity (WSOLA) for High-Quality Time-Scale Modification of Speech. In: proceedings of ICASSP-93, IEEE, pp. 554-557, the entire contents of which is incorporated herein by reference. FIG. 13 shows the effect of WSOLA, compared with the waveform (a), the waveform (b) is expanded in time (that is the speech speed is slowed down), but similar waveform is maintained, so that both pitch and timbre and maintained as much as possible and the listener will still perceive “natural” voice.

Alternatively, if a MDCT-based codec is used, it can simply be realized by inserting or removing MDCT (Modified discrete cosine transform) packets. If packet insertion or removal is not too excessive, the resulted artifacts are often negligible due to the inherent overlap-add operation in MDCT.

Similar to the discussion in the part “Spectral Separation” and the part “Spatial Separation”, when infrastructure capacity is low and/or the infrastructure traffic is high, then the time scaling may be switched off to save infrastructure resource. For this purpose, the audio processing apparatus may use the same infrastructure capacity/traffic detector (that is the condition detector 20) as in the embodiments discussed in the part “Spectral Separation” and the part “Spatial Separation”, or another similar condition detector.

When the condition detector 20 functions as an infrastructure capacity/traffic detector, the time scaling unit may be further configured to be disabled with respect to an audio signal in response to relatively low capacity and/or relatively high traffic in infrastructure related to the audio signal. Correspondingly, also provided is an embodiment of the audio processing method. That is, the method may further comprise a step of acquiring capacity and/or traffic information of infrastructure carrying the audio signals; and correspondingly, the time scaling step may be configured to be disabled with respect to an audio signal in response to relatively low capacity and/or relatively high traffic in infrastructure related to the audio signal.

Figure 14:
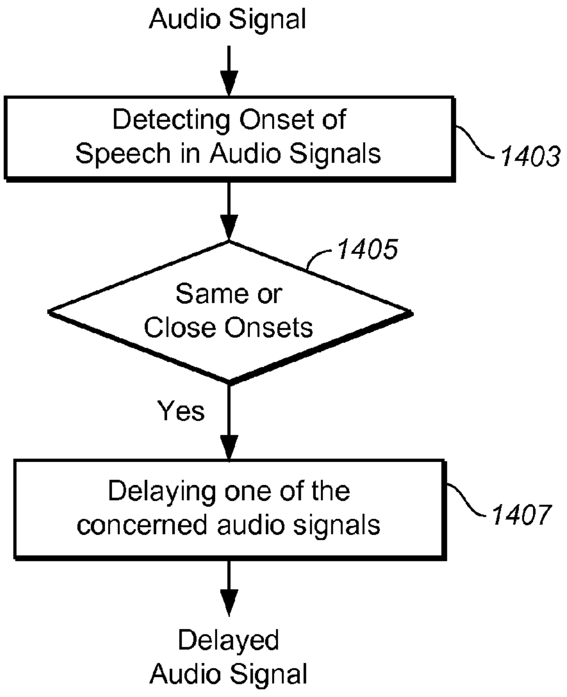
FIG. 14 is a flowchart illustrating an example audio processing method implementing time delaying according to an embodiment of the invention.

In another embodiment as shown in FIG. 14, an audio processing method is provided as comprising: detecting onset of speech in the at least two audio signals (Step 1403); delaying an audio signal (Step 1407) in response to the onset of speech in the audio signal being the same as or close to that in another audio signal (Step 1405); and mixing the at least two audio signals (not shown in FIG. 14). Correspondingly, also provided is an audio processing apparatus comprising: a speech onset detector configured to detect onset of speech in at least two audio signals; a delayer configured to delay an audio signal in response to the onset of speech in the audio signal being the same as or close to that in another audio signal; and a mixer configured to mix the at least two audio signals.

An onset of a speech can be detected through voice activity detectors (VAD) which are readily available in a voice processing chain. Delay of the onset of a speech may be realized simply by insertion of dummy frame or time slots before transmission of the audio segment containing the speech.

Similar to the time scaling, when infrastructure capacity is low and/or the infrastructure traffic is high, then the delaying operation may be switched off to save infrastructure resource. For this purpose, the audio processing apparatus may use the same infrastructure capacity/traffic detector (that is the condition detector 20) as in the embodiments discussed in the part “Spectral Separation” and the part “Spatial Separation”, or another similar condition detector.

When the condition detector 20 functions as an infrastructure capacity/traffic detector, the delayer may be further configured to be disabled with respect to an audio signal in response to relatively low capacity and/or relatively high traffic in infrastructure related to the audio signal. Correspondingly, also provided is an embodiment of the audio processing method. That is, the method may further comprise a step of acquiring capacity and/or traffic information of infrastructure carrying the audio signals; and correspondingly, the delaying step may be configured to be disabled with respect to an audio signal in response to relatively low capacity and/or relatively high traffic in infrastructure related to the audio signal.

Combination of Embodiments and Application Scenarios

As discussed in the part “Overall Construction”, spectral separation, spatial separation and temporal separation (including time scaling and time delaying) may be combined with each other arbitrarily. Therefore, all the embodiments and variant discussed in the parts “Spectral Separation”, “Spatial Separation” and “Temporal Separation” may be implemented in any combination thereof. And steps and/or components mentioned in different parts/embodiments but having the same or similar functions may be implemented as the same or separate steps and/or components.

In addition, in any embodiment/variation or any combination of embodiments/variations, the constituent steps/components may be implemented in a centralized manner or distributed manner. For example, all the steps/components may be realized in a centralized computing device such as a server (1520 in FIG. 15), which receives original audio signals via communication links connected to audio input devices 1540, 1560 such as microphones, and broadcasts improved mixed audio signal to listener device 1580 (e.g. loudspeaker). Alternatively, except the mixer/mixing step, the other steps/components may be realized at the side of listeners (such as the compensating step and the compensator), or in distributed audio input devices (such as any of the other steps and components).

Figure 15:
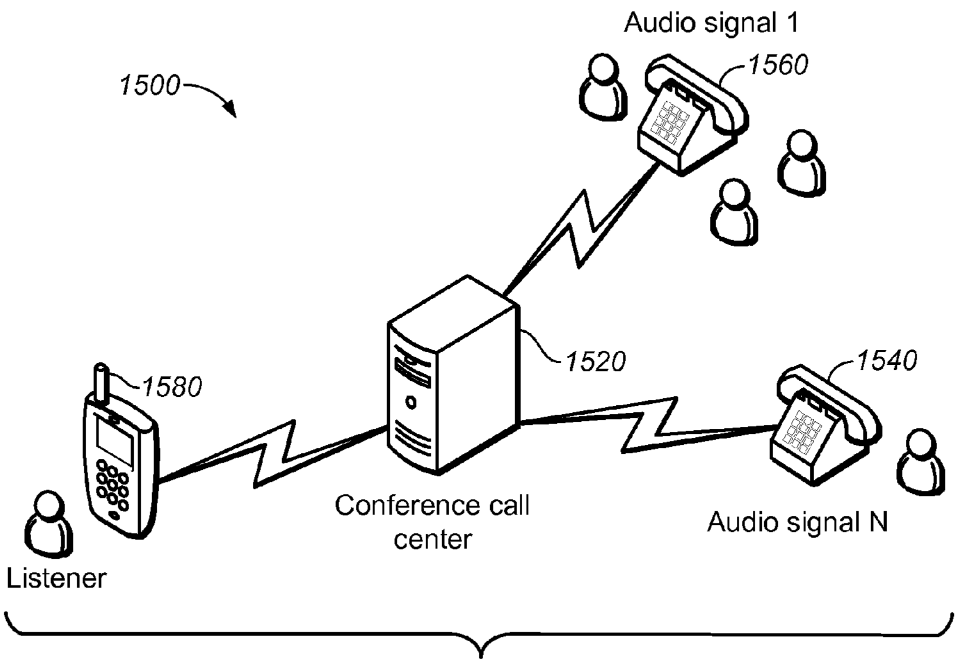
FIG. 15 is a diagram illustrating the application of the embodiments in a conference call system.

FIG. 15 shows an application scenario of the invention: a conference call system 1500. Multiple terminals 1540, 1560, 1580 are connected via communication links to a server 1520 in a conference call center. As mentioned above, except the mixing step/mixer must be realized in the server 1520, all the other steps/components may be realized either on the server or the terminals.

Other similar scenarios may include any other audio systems receiving multiple separate audio inputs and outputting an audio signal in mono-channel, such as stage audio systems, broadcasting systems as well as VoIP.

Figure 16:
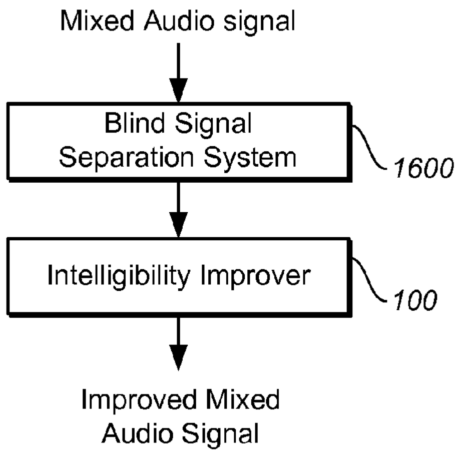
FIG. 16 is a block diagram illustrating an example audio processing apparatus according to an embodiment of the invention.

In the scenario shown in FIG. 15, the audio signals are captured separately. However, a scenario where the audio signals are captured together (already mixed) may also be contemplated. For example, in the conference call system 1500 shown in FIG. 15, around the audio input terminal 1560 there are multiple speakers. In one embodiment, we may take audio signal 1 comprising multiple speaker's voices as one single audio signal to be processed, so as to be distinguished better from the other audio signal such as audio signal N from the audio input terminal 1540. However, in an modified embodiment, we may implement a speaker-level intelligibility improvement by separating each speaker voice from the mixed audio signal captured by the audio input terminal 1560, and taking each speaker voice as an audio signal. In such a scenario, as shown in FIG. 16, the audio input terminal 1560 may comprise a blind signal separation (BSS) system for separating the speaker voices and an intelligibility improver 100 (that is the audio processing apparatus discussed before).

Another example of the scenario needing BSS processing is an audiophone helping hearing impaired people who have difficulty in understanding noisy speech. In such a scenario, BSS system may separate background audio signal (noise) and different speaker's voices, and the intelligibility improver of the present invention may be used to emphasize the voices and attenuating the noise, and improve intelligibility between different speakers.

Figure 17:
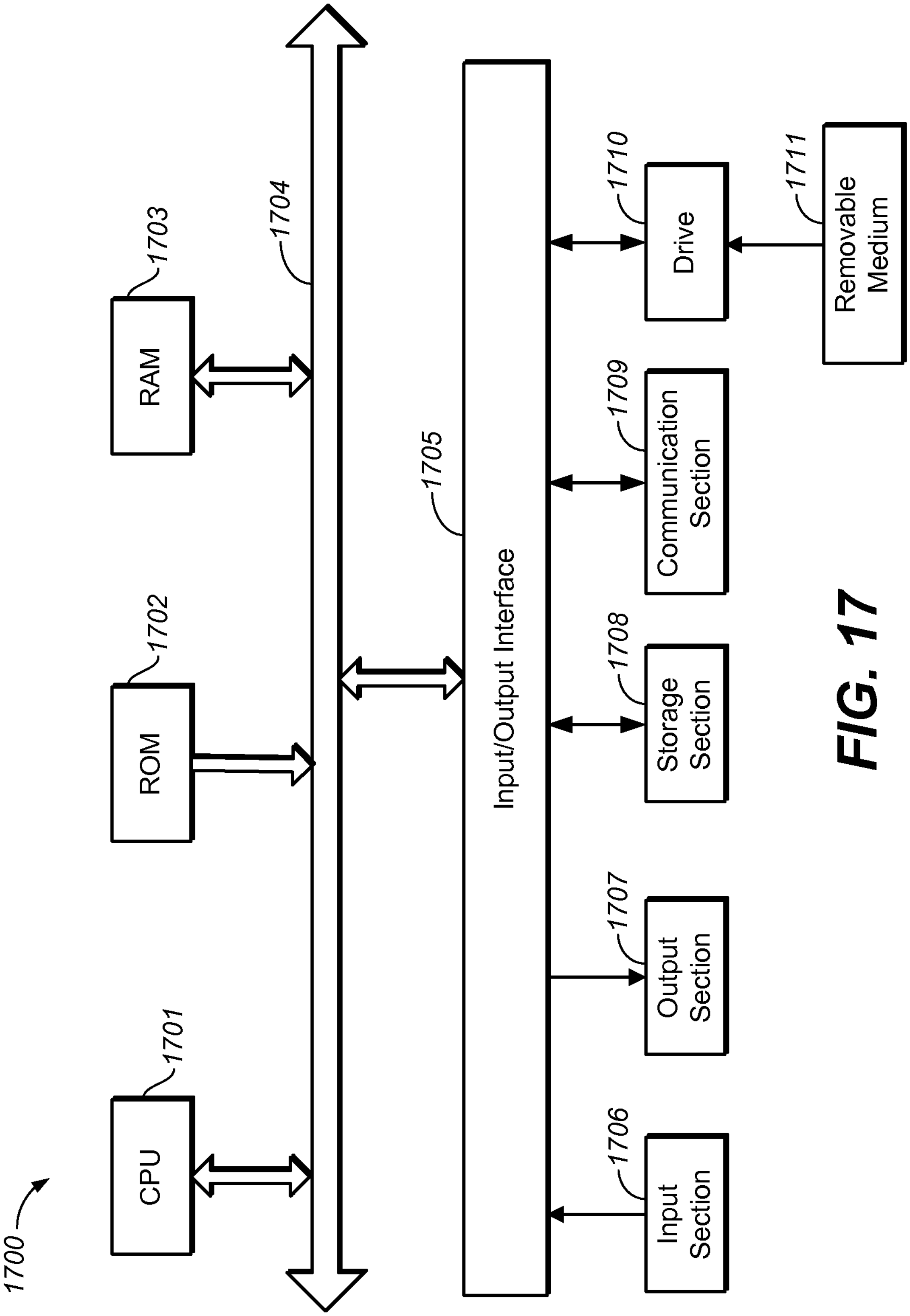
FIG. 17 is a block diagram illustrating an exemplary system for implementing embodiments of the present invention.

FIG. 17 is a block diagram illustrating an exemplary system for implementing the aspects of the present invention.

In FIG. 17, a central processing unit (CPU) 1701 performs various processes in accordance with a program stored in a read only memory (ROM) 1702 or a program loaded from a storage section 1708 to a random access memory (RAM) 1703. In the RAM 1703, data required when the CPU 1701 performs the various processes or the like are also stored as required.

The CPU 1701, the ROM 1702 and the RAM 1703 are connected to one another via a bus 1704. An input/output interface 1705 is also connected to the bus 1704.

The following components are connected to the input/output interface 1705: an input section 1706 including a keyboard, a mouse, or the like; an output section 1707 including a display such as a cathode ray tube (CRT), a liquid crystal display (LCD), or the like, and a loudspeaker or the like; the storage section 1708 including a hard disk or the like; and a communication section 1709 including a network interface card such as a LAN card, a modem, or the like. The communication section 1709 performs a communication process via the network such as the internet.

A drive 1710 is also connected to the input/output interface 1705 as required. A removable medium 1711, such as a magnetic disk, an optical disk, a magneto-optical disk, a semiconductor memory, or the like, is mounted on the drive 1710 as required, so that a computer program read therefrom is installed into the storage section 1708 as required.

In the case where the above-described steps and processes are implemented by the software, the program that constitutes the software is installed from the network such as the internet or the storage medium such as the removable medium 1711.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

From above, it could be seen the following exemplary embodiments (each an "EE") are described.

EE 1. An audio processing method comprising:

suppressing at least one first sub-band of a first audio signal to obtain a reduced first audio signal with reserved sub-bands, so as to improve the intelligibility of the reduced first audio signal, at least one second audio signal, or both the reduced first audio signal and the at least one second audio signal.

EE 2. The audio processing method according to EE 1, further comprising:

suppressing at least one second sub-band of the at least one second audio signal to obtain at least one reduced second audio signal with reserved sub-bands; and mixing the reduced first audio signal and the at least one reduced second audio signal.

EE 3. The audio processing method according to EE 2, wherein:

the reserved sub-bands of different audio signals do not overlap each other.

EE 4. The audio processing method according to EE 3, wherein the reserved sub-bands of each audio signal are distributed to cover both low and high frequency sub-bands of the audio signals.

EE 5. The audio processing method according to EE 3, wherein the reserved sub-bands of different audio signals are interleaved.

EE 6. The audio processing method according to EE 3, further comprising:

obtaining number of speakers/audio signals; and allocating reserved sub-bands to each audio signal, the width and the number of reserved sub-bands for each audio signal being determined based on the number of speakers/audio signals;

EE 7. The audio processing method according to EE 6, further comprising:

acquiring capacity and/or traffic information of infrastructure carrying the audio signals; and wherein, in the allocating step, allocating more and/or broader reserved sub-bands, or a full band to an audio signal, in response to relatively high capacity and/or relatively low traffic in infrastructure related to the audio signal.

EE 8. The audio processing method according to EE 6, further comprising:

acquiring importance information of the speakers/audio signals; and wherein, in the allocating step, allocating more and/or broader reserved sub-bands, or a full band to a speaker/audio signal, in response to relatively high importance of the corresponding speaker/audio signal.

EE 9. The audio processing method according to EE 6, further comprising:

detecting speaker similarity between different audio signals; and wherein, in the allocating step, allocating more and/or broader reserved sub-bands, or a full band to an audio signal, in response to relatively low speaker similarity between the audio signal and the other audio signal(s).

EE 10. The audio processing method according to anyone of EEs 2-9, further comprising:

detecting rhythmic similarity between different audio signals; and before the mixing step, applying time scaling to an audio signal in response to relatively high rhythmic similarity between the audio signal and the other audio signal(s).

EE 11. The audio processing method according to EE 10, wherein the rhythmic similarity between different audio signals is obtained by computing cross-correlation between the different audio signals.

EE 12. The audio processing method according to EE 10, wherein the rhythmic similarity between different audio signals is obtained by comparing beat/pitch accent timing in the different audio signals.

EE 13. The audio processing method according to EE 10, further comprising:

acquiring capacity and/or traffic information of infrastructure carrying the audio signals; and wherein, not applying the time scaling to an audio signal in response to relatively low capacity and/or relatively high traffic in infrastructure related to the audio signal.

EE 14. The audio processing method according to anyone of EEs 2-13, further comprising:

detecting onset of speech in different audio signals; and before the mixing step, delaying an audio signal in response to the onset of speech in the audio signal being the same as or close to that in another audio signal.

EE 15. The audio processing method according to EE 14, further comprising:

acquiring capacity and/or traffic information of infrastructure carrying the audio signals; and wherein, not delaying an audio signal in response to relatively low capacity and/or relatively high traffic in infrastructure related to the audio signal.

EE 16. The audio processing method according to any one of EE 1-15, comprising:

assigning the first audio signal at least one spatial auditory property, so that the first audio signal may be perceived as originating from a position relative to a listener.

EE 17. The audio processing method according to EE 16, wherein the assigning step comprises applying spatial filtering on the first audio signal so that the frequency spectrum of the first audio signal bears certain elevation and/or azimuth cues.

EE 18. The audio processing method according to EE 17, wherein the spatial filtering is HRTF-based filtering.

EE 19. The audio processing method according to anyone of EEs 16-17, further comprising:

compensating for a device-to-ear transfer function specific to a reproduction device.

EE 20. The audio processing method according to EE 16, further comprising:

acquiring capacity and/or traffic information of infrastructure carrying the first audio signal; and wherein, in response to relatively low capacity and/or relatively high traffic in the infrastructure, not assigning the first audio signal any spatial auditory property.

EE 21. The audio processing method according to EE 16, further comprising:

acquiring importance information of the first audio signal; and wherein, in response to relatively high importance of the corresponding speaker/audio signal, not assigning the first audio signal any spatial auditory property.

EE 22. An audio processing method comprising:

assigning a first audio signal at least one first spatial auditory property, so that the first audio signal may be perceived as originating from a first position relative to a listener.

EE 23. The audio processing method according to EE 22, further comprising:

assigning a second audio signal at least one second spatial auditory property, so that the second audio signal may be perceived as originating from a second position different from the first position; and mixing the first audio signal and the second audio signal.

EE 24. The audio processing method according to EE 22 or 23, wherein the assigning step comprises applying spatial filtering on the first or second audio signals so that the frequency spectrum of the first or second audio signal bears elevation and/or azimuth cues.

EE 25. The audio processing method according to EE 24, wherein the spatial filtering is HRTF-based filtering.

EE 26. The audio processing method according to anyone of EEs 23-25, further comprising:

before or after the mixing step, compensating for a device-to-ear transfer function specific to a reproduction device.

EE 27. The audio processing method according to EE 23, further comprising:

acquiring capacity and/or traffic information of infrastructure carrying the audio signals; and wherein, not assigning an audio signal any spatial auditory property, in response to relatively low capacity and/or relatively high traffic in infrastructure related to the audio signal.

EE 28. The audio processing method according to EE 23, further comprising:

acquiring importance information of speakers/audio signals; and wherein, not assigning an audio signal any spatial auditory property, in response to relatively high importance of the corresponding speaker/audio signal.

EE 29. The audio processing method according to anyone of EE 23-28, further comprising:

detecting rhythmic similarity between different audio signals; and before the mixing step, applying time scaling to an audio signal in response to relatively high rhythmic similarity between the audio signal and the other audio signal(s).

EE 30. The audio processing method according to EE 29, wherein the rhythmic similarity between different audio signals is obtained by computing cross-correlation between the different audio signals.

EE 31. The audio processing method according to EE 29, wherein the rhythmic similarity between different audio signals is obtained by comparing beat/pitch accent timing in the different audio signals.

EE 32. The audio processing method according to EE 29, further comprising:

acquiring capacity and/or traffic information of infrastructure carrying the audio signals; and wherein, not applying the time scaling to an audio signal in response to relatively low capacity and/or relatively high traffic in infrastructure related to the audio signal.

EE 33. The audio processing method according to anyone of EEs 23-32, further comprising:

detecting onset of speech in different audio signals; and before the mixing step, delaying an audio signal in response to the onset of speech in the audio signal being the same as or close to that in another audio signal.

EE 34. The audio processing method according to EE 33, further comprising:

acquiring capacity and/or traffic information of infrastructure carrying the audio signals; and wherein, not delaying an audio signal in response to relatively low capacity and/or relatively high traffic in infrastructure related to the audio signal.

EE 35. An audio processing method comprising:

detecting rhythmic similarity between at least two audio signals;

applying time scaling to an audio signal in response to relatively high rhythmic similarity between the audio signal and the other audio signal(s); and mixing the at least two audio signals.

EE 36. The audio processing method according to EE 35, wherein the rhythmic similarity between different audio signals is obtained by computing cross-correlation between the different audio signals.

EE 37. The audio processing method according to EE 35, wherein the rhythmic similarity between different audio signals is obtained by comparing beat/pitch accent timing in the different audio signals.

EE 38. The audio processing method according to EE 35, further comprising:

acquiring capacity and/or traffic information of infrastructure carrying the audio signals; and wherein, not applying the time scaling to an audio signal in response to relatively low capacity and/or relatively high traffic in infrastructure related to the audio signal.

EE 39. The audio processing method according to anyone of EEs 35-38, further comprising:

detecting onset of speech in the at least two audio signals; and before the mixing step, delaying an audio signal in response to the onset of speech in the audio signal being the same as or close to another audio signal.

EE 40. The audio processing method according to EE 39, further comprising:

acquiring capacity and/or traffic information of infrastructure carrying the audio signals; and wherein, not delaying an audio signal in response to relatively low capacity and/or relatively high traffic in infrastructure related to the audio signal.

EE 41. An audio processing method comprising:

detecting onset of speech in at least two audio signals;

delaying an audio signal in response to the onset of speech in the audio signal being the same as or close to that in another audio signal; and mixing the at least two audio signals.

EE 42. The audio processing method according to EE 41, further comprising:

acquiring capacity and/or traffic information of infrastructure carrying the audio signals; and wherein, not delaying an audio signal in response to relatively low capacity and/or relatively high traffic in infrastructure related to the audio signal.

EE 43. An audio processing apparatus comprising:

a spectral filter, configured to suppress at least one first sub-band of a first audio signal to obtain a reduced first audio signal with reserved sub-bands, so as to improve the intelligibility of the reduced first audio signal, at least one second audio signal or both the reduced first audio signal and the at least one second audio signal.

EE 44. The audio processing apparatus according to EE 43, wherein the spectral filter is further configured to suppress at least one second sub-band of the at least one second audio signal to obtain at least one reduced second audio signal with reserved sub-bands; and the audio processing apparatus further comprises:

a mixer, configured to mix the reduced first audio signal and the at least one reduced second audio signal.

EE 45. The audio processing apparatus according to EE 44, wherein:

the spectral filter is further configured so that the reserved sub-bands of different audio signals do not overlap each other.

EE 46. The audio processing apparatus according to EE 45, wherein the spectral filter is further configured so that the reserved sub-bands of each audio signal are distributed to cover both low and high frequency sub-bands of the audio signals.

EE 47. The audio processing apparatus according to EE 46, wherein the spectral filter is further configured so that the reserved sub-bands of different audio signals are interleaved.

EE 48. The audio processing apparatus according to EE 45, further comprising:

a speaker/audio signal number detector configured to obtain a number of speakers/audio signals; and wherein the spectral filter comprises a reserved sub-bands allocator configured to allocate reserved sub-bands to each audio signal, the width and the number of reserved sub-bands for each audio signal being determined based on the number of speakers/audio signals.

EE 49. The audio processing apparatus according to EE 48, further comprising:

an infrastructure capacity/traffic detector configured to acquire capacity and/or traffic information of infrastructure carrying the audio signals; and wherein, the reserved sub-bands allocator is further configured to allocate more and/or broader reserved sub-bands, or a full band to an audio signal, in response to relatively high capacity and/or relatively low traffic in infrastructure related to the audio signal.

EE 50. The audio processing apparatus according to EE 48, further comprising:

a speaker/audio signal importance detector configured to acquire importance information of the speakers/audio signals; and wherein, the reserved sub-bands allocator is further configured to allocate more and/or broader reserved sub-bands, or a full band to a speaker/audio signal, in response to relatively high importance of the corresponding speaker/audio signal.

EE 51. The audio processing apparatus according to EE 48, further comprising:

a speaker similarity detector configured to detect speaker similarity between different audio signals; and wherein, the reserved sub-bands allocator is further configured to allocate more and/or broader reserved sub-bands, or a full band to an audio signal, in response to relatively low speaker similarity between the audio signal and the other audio signal(s).

EE 52. The audio processing apparatus according to anyone of EEs 44-51, further comprising:

a rhythmic similarity detector configured to detect rhythmic similarity between different audio signals; and a time scaling unit configured to apply time scaling to an audio signal in response to relatively high rhythmic similarity between the audio signal and the other audio signal(s).

EE 53. The audio processing apparatus according to EE 52, wherein the rhythmic similarity detector is configured to detect rhythmic similarity by computing cross-correlation between the different audio signals.

EE 54. The audio processing apparatus according to EE 52, wherein the rhythmic similarity detector is configured to detect rhythmic similarity by comparing beat/pitch accent timing in the different audio signals.

EE 55. The audio processing apparatus according to EE 52, further comprising:

an infrastructure capacity/traffic detector configured to acquire capacity and/or traffic information of infrastructure carrying the audio signals; and wherein, the time scaling unit is configured to be disabled with respect to an audio signal in response to relatively low capacity and/or relatively high traffic in infrastructure related to the audio signal.

EE 56. The audio processing apparatus according to anyone of EEs 44-51, further comprising:

a speech onset detector configured to detect onset of speech in different audio signals; and a delayer configured to delay an audio signal in response to the onset of speech in the audio signal being the same as or close to that in another audio signal.

EE 57. The audio processing apparatus according to EE 56, further comprising:

an infrastructure capacity/traffic detector configured to acquire capacity and/or traffic information of infrastructure carrying the audio signals; and wherein, the delayer is configured to be disabled with respect to an audio signal in response to relatively low capacity and/or relatively high traffic in infrastructure related to the audio signal.

EE 58. The audio processing apparatus according to any one of EE 43-57, comprising:

a spatialization filter configured to assign the first audio signal at least one first spatial auditory property, so that the first audio signal may be perceived as originating from a position relative to a listener.

EE 59. The audio processing apparatus according to EE 58, wherein the spatialization filter is configured to filter the first audio signal so that the frequency spectrum of the first audio signal bears elevation and/or azimuth cues.

EE 60. The audio processing apparatus according to EE 58, wherein the spatialization filter is configured to conduct HRTF-based filtering.

EE 61. The audio processing apparatus according to anyone of EEs 58-60, further comprising:

a compensator configured to compensate for a device-to-ear transfer function specific to a reproduction device.

EE 62. The audio processing apparatus according to EE 58, further comprising:

an infrastructure capacity/traffic detector configured to acquire capacity and/or traffic information of infrastructure carrying the first audio signal; and wherein, the spatialization filter is configured to be disabled in response to relatively low capacity and/or relatively high traffic in infrastructure.

EE 63. The audio processing apparatus according to EE 58, further comprising:

an audio signal importance detector configured to acquire importance information of the first audio signal; and wherein, the spatialization filter is configured to be disabled in response to relatively high importance of the first audio signal.

EE 64. An audio processing apparatus comprising:

A spatialization filter configured to assign a first audio signal at least one first spatial auditory property, so that the first audio signal may be perceived as originating from a first position relative to a listener.

EE 65. The audio processing apparatus according to EE 64, wherein the spatialization filter is further configured to assign a second audio signal at least one second spatial auditory property, so that the second audio signal may be perceived as originating from a second position different from the first position; and the audio processing apparatus further comprises:

a mixer configured to mix the first audio signal and the second audio signal.

EE 66. The audio processing apparatus according to EE 64 or 65, wherein the spatialization filter is configured to filter the first or second audio signals so that the frequency spectrum of the first or second audio signal bears elevation and/or azimuth cues.

EE 67. The audio processing apparatus according to EE 66, wherein the spatialization filter is configured to conduct HRTF-based filtering.

EE 68. The audio processing apparatus according to anyone of EEs 65-67, further comprising:

a compensator configured to compensate for a device-to-ear transfer function specific to a reproduction device.

EE 69. The audio processing apparatus according to EE 65, further comprising:

an infrastructure capacity/traffic detector configured to acquire capacity and/or traffic information of infrastructure carrying the audio signals; and wherein, the spatialization filter is configured to be disabled with respect to an audio signal in response to relatively low capacity and/or relatively high traffic in infrastructure related to the audio signal.

EE 70. The audio processing apparatus according to EE 65, further comprising:

a speaker/audio signal importance detector configured to acquire importance information of the speakers/audio signals; and wherein, the spatialization filter is configured to be disabled with respect to an audio signal in response to relatively high importance of the corresponding speaker/audio signal.

EE 71. The audio processing apparatus according to anyone of EE 65-70, further comprising:

a rhythmic similarity detector configured to detect rhythmic similarity between different audio signals; and a time scaling unit configured to apply time scaling to an audio signal in response to relatively high rhythmic similarity between the audio signal and the other audio signal(s).

EE 72. The audio processing apparatus according to EE 71, wherein the rhythmic similarity detector is configured to detect rhythmic similarity by computing cross-correlation between the different audio signals.

EE 73. The audio processing apparatus according to EE 71, wherein the rhythmic similarity detector is configured to detect rhythmic similarity by comparing beat/pitch accent timing in the different audio signals.

EE 74. The audio processing apparatus according to EE 71, further comprising:

an infrastructure capacity/traffic detector configured to acquire capacity and/or traffic information of infrastructure carrying the audio signals; and wherein, the time scaling unit is configured to be disabled with respect to an audio signal in response to relatively low capacity and/or relatively high traffic in infrastructure related to the audio signal.

EE 75. The audio processing apparatus according to anyone of EEs 65-74, further comprising:

a speech onset detector configured to detect onset of speech in different audio signals; and a delayer configured to delay an audio signal in response to the onset of speech in the audio signal being the same as or close to that in another audio signal.

EE 76. The audio processing apparatus according to EE 75, further comprising:

an infrastructure capacity/traffic detector configured to acquire capacity and/or traffic information of infrastructure carrying the audio signals; and wherein, the delayer is configured to be disabled with respect to an audio signal in response to relatively low capacity and/or relatively high traffic in infrastructure related to the audio signal.

EE 77. An audio processing apparatus comprising:

a rhythmic similarity detector configured to detect rhythmic similarity between at least two audio signals;

a time scaling unit configured to apply time scaling to an audio signal in response to relatively high rhythmic similarity between the audio signal and the other audio signal(s); and a mixer configured to mix the at least two audio signals.

EE 78. The audio processing method according to EE 77, wherein the rhythmic similarity detector is configured to detect rhythmic similarity by computing cross-correlation between the different audio signals.

EE 79. The audio processing method according to EE 77, wherein the rhythmic similarity detector is configured to detect rhythmic similarity by comparing beat/pitch accent timing in the different audio signals.

EE 80. The audio processing apparatus according to EE 77, further comprising:

an infrastructure capacity/traffic detector configured to acquire capacity and/or traffic information of infrastructure carrying the audio signals; and wherein, the time scaling unit is configured to be disabled with respect to an audio signal in response to relatively low capacity and/or relatively high traffic in infrastructure related to the audio signal.

EE 81. The audio processing apparatus according to anyone of EEs 77-80, further comprising:

a speech onset detector configured to detect onset of speech in at least two audio signals; and a delayer configured to delay an audio signal in response to the onset of speech in the audio signal being the same as or close to that in another audio signal.

EE 82. The audio processing apparatus according to EE 81, further comprising:

an infrastructure capacity/traffic detector configured to acquire capacity and/or traffic information of infrastructure carrying the audio signals; and wherein, the delayer is configured to be disabled with respect to an audio signal in response to relatively low capacity and/or relatively high traffic in infrastructure related to the audio signal.

EE 83. An audio processing apparatus comprising:

a speech onset detector configured to detect onset of speech in at least two audio signals;

a delayer configured to delay an audio signal in response to the onset of speech in the audio signal being the same as or close to that in another audio signal; and a mixer configured to mix the at least two audio signals.

EE 84. The audio processing apparatus according to EE 83, further comprising:

an infrastructure capacity/traffic detector configured to acquire capacity and/or traffic information of infrastructure carrying the audio signals; and wherein, the delayer is configured to be disabled with respect to an audio signal in response to relatively low capacity and/or relatively high traffic in infrastructure related to the audio signal.

EE 85. A computer-readable medium having computer program instructions recorded thereon for enabling a processor to perform audio processing, the computer program instructions comprising: means for suppressing at least one first sub-band of a first audio signal to obtain a reduced first audio signal with reserved sub-bands, so as to improve the intelligibility of the reduced first audio signal, at least one second audio signal, or both the reduced first audio signal and the at least one second audio signal.

EE 86. A computer-readable medium having computer program instructions recorded thereon for enabling a processor to perform audio processing, the computer program instructions comprising: means for assigning a first audio signal at least one first spatial auditory property, so that the first audio signal may be perceived as originating from a first position relative to a listener.

EE 87. A computer-readable medium having computer program instructions recorded thereon for enabling a processor to perform audio processing, the computer program instructions comprising: means for detecting rhythmic similarity between at least two audio signals; means for applying time scaling to an audio signal in response to relatively high rhythmic similarity between the audio signal and the other audio signal(s); and means for mixing the at least two audio signals.

EE 88. A computer-readable medium having computer program instructions recorded thereon for enabling a processor to perform audio processing, the computer program instructions comprising: means for detecting onset of speech in at least two audio signals; means for delaying an audio signal in response to the onset of speech in the audio signal being the same as or close to that in another audio signal; and means for mixing the at least two audio signals.

It is claimed:

1. An audio processing method comprising:

suppressing at least one first sub-band of a first audio signal to obtain a reduced first audio signal with reserved sub-bands, so as to improve the intelligibility of the reduced first audio signal, at least one second audio signal, or both the reduced first audio signal and the at least one second audio signal;

suppressing at least one second sub-band of the at least one second audio signal to obtain at least one reduced second audio signal with reserved sub-bands; and mixing the reduced first audio signal and the at least one reduced second audio signal, wherein the reserved sub-bands of different ones of the audio signals do not overlap, and the reserved sub-bands of each said audio signal are distributed to cover both low and high frequency sub-bands of the audio signals.

2. An audio processing method comprising:

suppressing at least one first sub-band of a first audio signal to obtain a reduced first audio signal with reserved sub-bands, so as to improve the intelligibility of the reduced first audio signal, at least one second audio signal, or both the reduced first audio signal and the at least one second audio signal;

suppressing at least one second sub-band of the at least one second audio signal to obtain at least one reduced second audio signal with reserved sub-bands, wherein the reserved sub-bands of different ones of the audio signals do not overlap;

mixing the reduced first audio signal and the at least one reduced second audio signal;

obtaining a number of speakers and/or a number of audio signals; and allocating reserved sub-bands to each said audio signal, the width and the number of reserved sub-bands for each said audio signal being determined based on the number of speakers and/or the number of audio signals.

3. The audio processing method according to claim 2, further comprising:

acquiring capacity and/or traffic information of infrastructure carrying the audio signals; and wherein, in the allocating step, allocating more and/or broader reserved sub-bands, or a full band to an audio signal, in response to relatively high capacity and/or relatively low traffic in infrastructure related to the audio signal.

4. The audio processing method according to claim 2, further comprising:

acquiring importance information of the speakers/audio signals; and wherein, in the allocating step, allocating more and/or broader reserved sub-bands, or a full band to a speaker/audio signal, in response to relatively high importance of the corresponding speaker/audio signal.

5. The audio processing method according to claim 2, further comprising:

detecting speaker similarity between different ones of the audio signals; and wherein, in the allocating step, allocating more and/or broader reserved sub-bands, or a full band to an audio signal, in response to relatively low speaker similarity between the audio signal and the other audio signal(s).

6. An audio processing method comprising:

suppressing at least one first sub-band of a first audio signal to obtain a reduced first audio signal with reserved sub-bands, so as to improve the intelligibility of the reduced first audio signal, at least one second audio signal, or both the reduced first audio signal and the at least one second audio signal;

suppressing at least one second sub-band of the at least one second audio signal to obtain at least one reduced second audio signal with reserved sub-bands, wherein the reserved sub-bands of different ones of the audio signals do not overlap;

mixing the reduced first audio signal and the at least one reduced second audio signal;

detecting rhythmic similarity between different ones of the audio signals; and before the mixing step, applying time scaling to an audio signal in response to relatively high rhythmic similarity between the audio signal and the other audio signal(s).

7. The audio processing method according to claim 6, wherein the rhythmic similarity between different audio signals is obtained by computing cross-correlation between the different audio signals.

8. The audio processing method according to claim 6, wherein the rhythmic similarity between different audio signals is obtained by comparing beat/pitch accent timing in the different audio signals.

9. An audio processing apparatus comprising:

a spectral filter, configured to suppress at least one first sub-band of a first audio signal to obtain a reduced first audio signal with reserved sub-bands, and suppress at least one second sub-band of at least one second audio signal to obtain at least one reduced second audio signal with reserved sub-bands, so as to improve the intelligibility of the reduced first audio signal, the at least one reduced second audio signal, or both the reduced first audio signal and the at least one reduced second audio signal; and a mixer, configured to mix the reduced first audio signal and the at least one reduced second audio signal, wherein the spectral filter is further configured so that the reserved sub-bands of different ones of the audio signals do not overlap each other and so that the reserved sub-bands of each audio signal are distributed to cover both low and high frequency sub-bands of the audio signals.

10. The audio processing apparatus according to claim 9, wherein the spectral filter is further configured so that the reserved sub-bands of different audio signals are interleaved.

11. An audio processing apparatus, further comprising:

a spectral filter, configured to suppress at least one first sub-band of a first audio signal to obtain a reduced first audio signal with reserved sub-bands, and suppress at least one second sub-band of at least one second audio signal to obtain at least one reduced second audio signal with reserved sub-bands, so as to improve the intelligibility of the reduced first audio signal, the at least one reduced second audio signal, or both the reduced first audio signal and the at least one reduced second audio signal, wherein the spectral filter is further configured so that the reserved sub-bands of different ones of the audio signals do not overlap each other; and a mixer, configured to mix the reduced first audio signal and the at least one reduced second audio signal; and a speaker/audio signal number detector configured to obtain a number of speakers and/or a number of audio signals; and wherein the spectral filter comprises a reserved sub-bands allocator configured to allocate reserved sub-bands to each audio signal, the width and the number of reserved sub-bands for each audio signal being determined based on the number of speakers and/or the number of audio signals.

* * * * *